United States Patent
Hong et al.

(10) Patent No.: US 11,959,806 B2
(45) Date of Patent: Apr. 16, 2024

(54) MEMS SENSORS AND SYSTEMS

(71) Applicant: Obsidian Sensors, Inc., San Diego, CA (US)

(72) Inventors: John Hong, San Diego, CA (US); Bing Wen, San Diego, CA (US); Edward Chan, San Diego, CA (US); Tallis Chang, San Diego, CA (US); Sean Andrews, San Diego, CA (US)

(73) Assignee: Obsidian Sensors, Inc., San Diego, CA (US)

( * ) Notice: Subject to any disclaimer, the term of this patent is extended or adjusted under 35 U.S.C. 154(b) by 0 days.

(21) Appl. No.: 18/132,773

(22) Filed: Apr. 10, 2023

(65) Prior Publication Data
US 2023/0314228 A1     Oct. 5, 2023

Related U.S. Application Data

(63) Continuation of application No. 17/267,789, filed as application No. PCT/US2019/046066 on Aug. 9, 2019, now Pat. No. 11,624,657.

(60) Provisional application No. 62/765,151, filed on Aug. 17, 2018, provisional application No. 62/717,676, filed on Aug. 10, 2018.

(51) Int. Cl.
| | |
|---|---|
| *G01J 5/20* | (2006.01) |
| *B81B 3/00* | (2006.01) |
| *G01J 5/02* | (2022.01) |
| *H04N 23/11* | (2023.01) |

(52) U.S. Cl.
CPC ............ *G01J 5/024* (2013.01); *B81B 3/0029* (2013.01); *G01J 5/20* (2013.01); *H04N 23/11* (2023.01); *B81B 2201/047* (2013.01)

(58) Field of Classification Search
CPC ........... G01J 5/024; G01J 5/20; B81B 3/0029; B81B 2201/047; H04N 5/332
See application file for complete search history.

(56) References Cited

U.S. PATENT DOCUMENTS

| | | | |
|---|---|---|---|
| 4,235,951 A | 11/1980 | Swarovski | |
| 4,556,292 A | 12/1985 | Mathyssek | |
| 5,239,179 A | 8/1993 | Baker | |
| 2008/0035846 A1 | 2/2008 | Talghader | |
| 2008/0217539 A1* | 9/2008 | Talghader | A61B 17/3478 250/340 |
| 2012/0085892 A1 | 4/2012 | Hirose | |
| 2016/0097681 A1 | 4/2016 | Buchan | |
| 2017/0254704 A1 | 9/2017 | Becker et al. | |

FOREIGN PATENT DOCUMENTS

WO   WO-2019/178402    9/2019

* cited by examiner

*Primary Examiner* — David P Porta
*Assistant Examiner* — Fani Polyzos Boosalis
(74) *Attorney, Agent, or Firm* — Procopio, Cory, Hargreaves & Savitch LLP

(57) ABSTRACT

Disclosed herein are MEMS devices and systems and methods of manufacturing or operating the MEMS devices and systems. In some embodiments, the MEMS devices and systems are used in imaging applications.

20 Claims, 14 Drawing Sheets

MEMS SENSORS AND SYSTEMS

CROSS REFERENCE TO RELATED APPLICATIONS

This Application is a continuation of U.S. patent application Ser. No. 17/267,789, filed Aug. 9, 2019, now allowed, which is a national stage application under 35 U.S.C. § 371 of International Application No. PCT/US2019/046066, filed internationally on Aug. 9, 2019, which claims the benefit of U.S. Provisional Application No. 62/717,676, filed on Aug. 10, 2018 and U.S. Provisional Application No. 62/765,151, filed on Aug. 17, 2018, the entire disclosures of which are herein incorporated by reference for all purposes.

FIELD

This disclosure generally relates to MEMS sensors. More specifically, this disclosure relates to devices and method for transmitting and detecting radiation.

BACKGROUND

The terahertz (THz) spectrum holds a lot of promise for a broad array of applications, the most prominent being imagining applications. This part of the electromagnetic spectrum is sometimes called the "terahertz gap" due to the lack of proper sources and detectors that can facilitate commercial success. Devices and methods described herein are applicable to the terahertz gap, in addition to other wavelengths.

SUMMARY

Disclosed herein are MEMS devices and systems and methods of manufacturing or operating the MEMS devices and systems. In some embodiments, the MEMS devices and systems are used in imaging applications.

In some embodiments, a microelectromechanical system comprises a glass substrate configured to pass radiation from a first surface of the glass substrate through a second surface of the glass substrate, the glass substrate comprising TFT circuitry; a lid comprising a surface; spacers separating the lid and glass substrate; a cavity defined by the spacers, surface of the lid, and second surface of the glass substrate; a pixel in the cavity, positioned on the second surface of the glass substrate, electrically coupled to the TFT circuitry, and comprising an absorber to detect the radiation; and a reflector to direct the radiation to the absorber and positioned on the lid.

In some embodiments, the spacers include material from a sacrificial layer.

In some embodiments, the reflector and absorber are separated by one quarter of the wavelength of the radiation.

In some embodiments, the reflector comprises a plurality of reflectors, each corresponding to a respective pixel.

In some embodiments, the substrate includes one or more of fused silica and quartz and has a thickness in the range 50 to 200 μm.

In some embodiments, the microelectromechanical system further comprises a plurality of pixels in the cavity.

In some embodiments, the reflector is positioned on a surface of the lid.

In some embodiments, the reflector is the lid.
In some embodiments, the reflector is inside the lid.

In some embodiments, a method of manufacturing a microelectromechanical system comprises: providing a glass substrate comprising TFT circuitry and configured to pass radiation from a first surface of the glass substrate through a second surface of the glass substrate; disposing a pixel comprising an absorber to detect the radiation on the second surface of the glass substrate; attaching spacers to the second surface of the glass substrate; positioning a reflector on a lid, the reflector configured to direct the radiation to the absorber; and attaching the lid to the spacers.

In some embodiments, the method further comprises forming a cavity defined by the spacers, the lid, and the second surface of the glass substrate.

In some embodiments, the method further comprises forming the spacers using material from a sacrificial layer.

In some embodiments, the method further comprises separating the reflector and absorber by one quarter of the wavelength of the radiation.

In some embodiments, positioning the reflector comprises positioning a plurality of reflectors, each corresponding to a respective pixel.

In some embodiments, the substrate includes one or more of fused silica and quartz and has a thickness in the range 50 to 200 μm.

In some embodiments, the method further comprises disposing a plurality of pixels on the second surface of the glass substrate.

In some embodiments, the method further comprises positioning the reflector on the lid.

In some embodiments, the reflector is the lid.

In some embodiments, the method further comprises positioning the reflector in the lid.

In some embodiments, a microelectromechanical system comprises: a plurality of pixels; a plurality of local capacitors; and a plurality of global sampling switches, each electrically coupled to a respective pixel, a respective local capacitor, and a globally addressed sampling signal, wherein the globally addressed sampling signal is configured to electrically couple each pixel to the respective local capacitor by switching the plurality of global sampling switches to a conducting state, and the plurality of pixels are configured to sense radiation in terahertz frequencies.

In some embodiments, the microelectromechanical system further comprises a plurality of readout switches, wherein the plurality of readout switches and the plurality of local capacitors are arranged in rows, each row associated with a row address, each readout switch is electrically coupled to a respective local capacitor, a column associated with a column address and electrically coupled to readout circuitry, and a respective row addressing signal configured to electrically couple the respective local capacitor to the column and the readout circuitry by switching the readout switch to a conducting state, and each pixel includes a unique address comprising a unique combination of the row address and the column address.

In some embodiments, each pixel comprises sub-pixels, and each local capacitor is configured to sample a total pixel charge corresponding to the sub-pixels of the corresponding pixel.

In some embodiments, a method of operating a microelectromechanical system comprising a plurality of pixels, a plurality of local capacitors, and a plurality of global sampling switches each electrically coupled to a respective pixel, a respective local capacitor, and a globally addressed sampling signal, the method comprises: switching, with the globally addressed sampling signal, the plurality of global sampling switches to a conducting state; electrically coupling each pixel to the respective local capacitor; sensing, with the plurality of pixels, a radiation in terahertz frequencies; generating a current at each pixel based on the sensed radiation and a bias voltage; and charging the respective local capacitor with the current.

In some embodiments, the microelectromechanical system further comprises a plurality of readout switches, the plurality of readout switches and the plurality of local capacitors are arranged in rows, each row associated with a row address, each readout switch is electrically coupled to a respective local capacitor, a column associated with a column address and electrically coupled to readout circuitry, and a respective row addressing signal, and each pixel includes a unique address comprising a unique combination of the row address and the column address, the method further comprises: switching, with the respective row addressing signal, a readout switch to a conducting state; electrically coupling the respective local capacitor to a respective column; and discharging the respective local capacitor to the respective column and the readout circuitry.

In some embodiments, each pixel comprises sub-pixels, the method further comprises: sampling, with each local capacitor, a total pixel charge corresponding to the sub-pixels of the corresponding pixel.

In some embodiments, an illumination source comprises: a voltage source; a wire grid electrically coupled to the voltage source, configured to transmit radiation at a wavelength, and having a pitch at a first fraction of the wavelength; a reflective surface separated from the wire grid by a second fraction of the wavelength; and spacers separating the wire grid and the reflective surface.

In some embodiments, the wavelength is in a range of 0.1 millimeter to 3 millimeters.

In some embodiments, the first fraction is up to four-fifths and the second fraction is one quarter.

In some embodiments, the reflective surface comprises an electrically conductive material.

In some embodiments, a surface impedance of the wire grid matches an impedance of a medium in which the radiation is transmitted, and the surface impedance is based on a thickness of the wire grid.

In some embodiments, the wire grid comprises one or more selected from a conductive oxide, conductive nitride, and silicide.

In some embodiments, the wire grid is annealed.

In some embodiments, the illuminator source further comprises a wire grid support comprising a thermally insulating material.

In some embodiments, the illuminator source further comprises a second reflective surface separated from the wire grid by a third fraction of a second wavelength, wherein the wire grid is further configured to transmit radiation at the second wavelength.

In some embodiments, the wire grid comprises a diamond pattern.

In some embodiments, the wire grid comprises a periodic pattern.

In some embodiments, a method of manufacturing an illumination source, comprises: providing a wire grid configured to transmit radiation at a wavelength, and having a pitch at a first fraction of the wavelength; providing a reflective surface; separating the wire grid and the reflective surface with spacers, the reflective surface separated from the wire grid by a second fraction of the wavelength; and electrically coupling a voltage source to the wire grid.

In some embodiments, the wavelength is in a range of 0.1 millimeter to 3 millimeters.

In some embodiments, the first fraction is up to four-fifths and the second fraction is one quarter.

In some embodiments, the reflective surface comprises an electrically conductive material.

In some embodiments, a surface impedance of the wire grid matches a medium in which the radiation is transmitted, and the surface impedance is based on a thickness of the wire grid.

In some embodiments, the wire grid comprises one or more selected from a conductive oxide, conductive nitride, and silicide.

In some embodiments, the method further comprises annealing the wire grid.

In some embodiments, the method further comprises providing a wire grid support comprising a thermally insulating material.

In some embodiments, the method comprises providing a second reflective surface separated from the wire grid by a third fraction of a second wavelength, wherein the wire grid is further configured to transmit radiation at the second wavelength.

In some embodiments, the method further comprises forming the wire grid in a diamond pattern.

In some embodiments, the method further comprises forming the wire grid in a periodic pattern.

In some embodiments, an imaging system comprises: an illumination source configured to illuminate an object with radiation in terahertz frequencies, the object scattering the radiation, the scattered radiation having a phase; a detector array; and a local oscillator source configured to illuminate the detector array, wherein the detector array is configured to detect radiation comprising radiation scattered from the object and radiation from the local oscillator source, a power of the detected radiation is greater than a power of the scattered radiation, and an intensity distribution associated with the detected radiation includes information associated with the phase.

In some embodiments, an intensity distribution associated with the radiation includes the scattered radiation amplified by a gain, the gain is based on a power of a local oscillator illumination and an area of the detector array.

In some embodiments, the local oscillator source is further configured to illuminate the detector array at an angle with respect to the scattered radiation, and an intensity distribution associated with the radiation includes a component comprising the phase and the angle.

In some embodiments, the imaging system further comprises: a processor; memory; and a program stored in the memory and configured to be executed by the processor, the program including instructions for performing a method comprising recovering the phase from an intensity distribution associated with the detected radiation.

In some embodiments, the radiation from the illumination source and illumination from the local oscillator are phase-locked.

In some embodiments, a method of operating an imaging system comprises: illuminating, with an illumination source, an object with radiation in terahertz frequencies; scattering, with the object, the radiation, wherein the scattered radiation has a phase; illuminating, with a local oscillator source, a detector array; detecting, with the detector array, radiation comprising radiation scattered from the object and radiation from the local oscillator source; and recovering the phase of the scattered radiation based on the detected radiation.

In some embodiments, the method further comprises amplifying the scattered radiation by a gain to generate an intensity distribution associated with the radiation, wherein the gain is based on a power of a local oscillator illumination and an area of the detector array.

In some embodiments, illuminating, with a local oscillator source, a detector array further comprises illuminating the detector array at an angle with respect to the scattered radiation, and an intensity distribution associated with the radiation includes a component comprising the phase and the angle.

In some embodiments, recovering the phase of the scattered radiation based on the detected radiation further comprises recovering the phase from an intensity distribution associated with the detected radiation.

In some embodiments, the method further comprises phase-locking the radiation illuminated from the illumination source and illumination from the local oscillator.

In some embodiments, a microelectromechanical system comprises: a pixel comprising an absorber to detect radiation having a wavelength; and a reflector to direct radiation transmitted through the absorber, wherein the directed radiation and the radiation transmitted through the absorber have a phase difference, the reflector and the absorber are separated by a distance associated with a second phase, and twice the second phase added to the phase difference equals zero or 360 degrees.

In some embodiments, the reflector comprises a metasurface including electromagnetic structures, the electromagnetic structures are smaller than the wavelength and configured for electromagnetic polarization, and the metasurface is configured to direct the radiation transmitted through the absorber.

In some embodiments, the reflector comprises a high impedance conductor.

In some embodiments, the microelectromechanical system further comprises a plurality of pixels, each pixel comprising an absorber to detect the radiation.

In some embodiments, a method of manufacturing a microelectromechanical system comprises: providing a pixel comprising an absorber to detect radiation having a wavelength; providing a reflector to direct radiation transmitted through the absorber; and separating the reflector and the absorber by a distance associated with a second phase, wherein the directed radiation and the radiation transmitted through the absorber have a phase difference, and twice the second phase added to the phase difference equals zero or 360 degrees.

In some embodiments, providing the reflector further comprises providing a metasurface including electromagnetic structures, the electromagnetic structures are smaller than the wavelength and configured for electromagnetic polarization, and the metasurface is configured to direct the radiation transmitted through the absorber.

In some embodiments, providing the reflector further comprises providing a high impedance conductor.

In some embodiments, the method further comprises providing a plurality of pixels, each pixel comprising an absorber to detect the radiation.

In some embodiments, a system comprises: a first imaging system comprising a first optical aperture and configured to capture first image data in a first spectral band; a second imaging system comprising a second optical aperture and configured to capture second image data in a second spectral band different from the first spectral band; and an image processor configured to: receive the first image data, receive the second image data, and establish common image features from the first image data and second image data.

In some embodiments, the image processor is further configured to compute correspondence geometry from the common image features.

In some embodiments, the first optical aperture is axially aligned with the second optical aperture.

In some embodiments, the first imaging system and the second imaging system share optics and portions of an optical path.

In some embodiments, the first imaging system and the second imaging system share a reflective three-mirror anastigmat (TMA) with a beam splitter that splits an incoming beam into the first spectral band and the second spectral band.

In some embodiments, the first imaging system and the second imaging system share TMA optics configured to eliminate primary optical aberrations and incorporate a 50 cm working distance.

In some embodiments, the first optical aperture is not axially aligned with the second optical aperture.

In some embodiments, the first spectral band comprises long-wave infrared radiation and the second spectral band comprises terahertz radiation.

In some embodiments, the system further comprises a terahertz illuminator.

In some embodiments, the first spectral band comprises long-wave infrared radiation and the second spectral band comprises visible-wavelength radiation.

In some embodiments, a method of operating a system comprising a first imaging system comprising a first optical aperture and a second imaging system comprising a second optical aperture, the method comprises: capturing, with the first imaging system, first image data in a first spectral band; capturing, with the second imaging system, second image data in a second spectral band different from the first spectral band; receiving the captured first image data; receiving the captured second image data; and establishing common image features from the first image data and second image data.

In some embodiments, the method further comprises computing correspondence geometry from the common image features.

In some embodiments, the method further comprises axially aligning the first optical aperture with the second optical aperture.

In some embodiments, the method further comprises sharing optics and portions of an optical path between the first imaging system and the second imaging system.

In some embodiments, the method further comprises: sharing a reflective TMA with a beam splitter between the first imaging system and the second imaging system; and splitting an incoming beam into the first spectral band and the second spectral band.

In some embodiments, the method further comprises: sharing TMA optics between the first imaging system and the second imaging system; eliminating primary optical aberrations; and incorporating a 50 cm working distance.

In some embodiments, the method further comprises the first optical aperture is not axially aligned with the second optical aperture.

In some embodiments, the first spectral band comprises long-wave infrared radiation and the second spectral band comprises terahertz radiation.

In some embodiments, the exoscope further comprises a terahertz illuminator.

In some embodiments, the first spectral band comprises long-wave infrared radiation and the second spectral band comprises visible-wavelength radiation.

DETAILED DESCRIPTION OF EXEMPLARY EMBODIMENTS

In the following description of embodiments, reference is made to the accompanying drawings which form a part hereof, and in which it is shown by way of illustration specific embodiments which can be practiced. It is to be understood that other embodiments can be used and structural changes can be made without departing from the scope of the disclosed embodiments.

Figure 1:
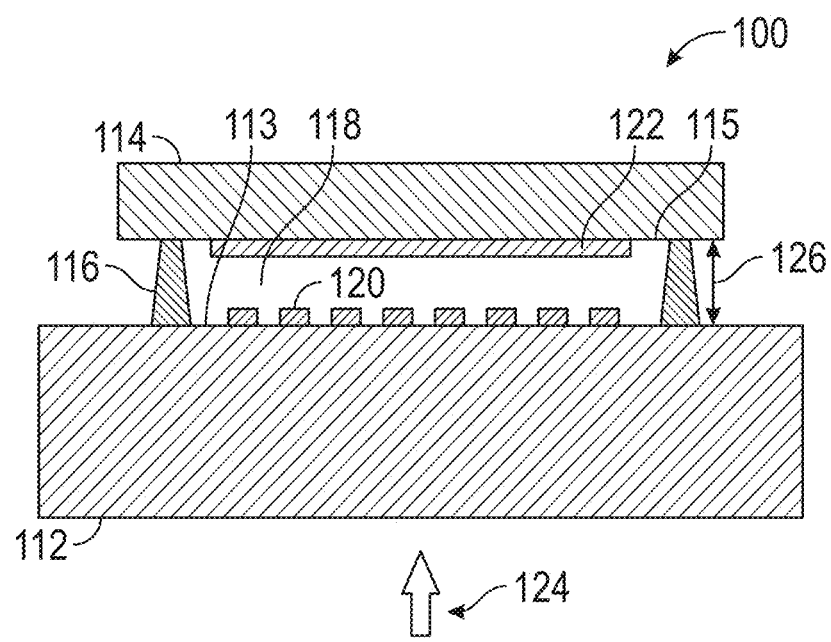
FIG. 1 illustrates a MEMS device, in accordance with an embodiment.

FIG. 1 illustrates a MEMS device 100. As illustrated, the MEMS device 100 includes a substrate 112, a lid 114, spacers 116, cavity 118, pixels 120, and reflector 122. As illustrated, the cavity 118 is defined by the spacers 116, the surface 115 of the lid 114, and the surface 113 of the substrate 112.

In some embodiments, the MEMS device 100 includes a vacuum port for vacuum encapsulation (e.g., vacuum port 1214, as described below) (not shown). In some embodiments, the vacuum port can integrated into the spacers 116. In some examples, the vacuum seal can be made with metal solders or glass to silicon or glass to glass or silicon to silicon laser welding methods.

In some embodiments, the MEMS device 100 is a camera sensor in an imaging system. For example, radiation 124 passes a first surface of the substrate 112 and through a second surface 113 (e.g., the surface on which the pixels 120 are disposed) of the substrate 112. The radiation 124 passes through second surface 113 and is at least partially absorbed by pixels 120 (or absorbers of the pixels 120). Radiation that is not absorbed by the pixels 120 can travel to the reflector 122 and be redirected back to pixels 120. In some embodiments, the MEMS device 100 is bolometer device. In some embodiments, the pixels 120 or its absorbers are configured to absorb radiation in THz frequencies (e.g., the absorbers are THz bolometers absorbers). In some embodiments, each of the pixels 120 includes an absorber.

Although a plurality of pixels is shown, it is understood that the MEMS device 100 may include a single pixel 120 in cavity 118. In some embodiments, the substrate 112 is configured to pass radiation (e.g., radiation in the terahertz (THz) band, incoming radiation 124).

As an exemplary advantage, the MEMS device 100 can efficiently absorb radiation 124 and may include less structural components compared to alternative solutions. By disposing the pixels on the second surface of the substrate and using a substrate (e.g., a glass substrate) configured to pass the radiation, less structural components may be required to position the pixels 120 or absorbers opposing the reflector 122. An alternative solution may include suspending the absorbers above a reflector, using additional structural components to encapsulate the device, and using longer spacers to accommodate the suspended absorbers. By disposing the pixels or absorbers on the substrate configured to pass radiation, radiation can be absorbed efficiently—radiation that is not initially absorbed by pixels 120 may be absorbed after it is being redirected from the reflector 122 and elements of the camera sensor can be minimized—the substrate can function as both a radiation transmission component and a structural component.

In some examples, the substrate 112 may be manufactured from glass. For example, an IMG process (exemplary processes are disclosed in International Appln No. PCT/US2019/022338, the entirety of which is incorporated herein by reference) is used to realize microbolometer arrays (e.g., pixels 120) with pixel pitch in the range 20-1000 μm. In some embodiments with a HD resolution (e.g., FHD: 1920×1080) camera sensor, the sensor active area could occupy an area in the range 38.4×21.6 mm$^2$ (=829.44 mm$^2$) to 1920×1080 mm$^2$ (=2073600 mm$^2$). Advantageously, embodiments herein accommodate such large areas without dividing up the sensor real estate into sub-panels.

In some embodiments, the substrate can include materials with lower loss in the wavelength of interest (e.g., millimeter wavelengths, THz frequencies, 0.1 millimeter to 3 millimeters) such as fused silica and quartz. In some embodiments, the thickness of the substrate 112 is in the range of 50 to 200 μm using substrate glass. For example, at the beginning of fabrication procedure, a thin glass substrate can be attached to a thicker glass substrate with a release layer in between the two substrates. The fabrication procedure can be performed on top of the composite substrate formed by the thin glass substrate and the thicker glass substrate. After a device is formed (e.g., before or after vacuum encapsulation), the device is removed from the thicker substrate (in this embodiment, the thicker substrate can be understood to be a handling layer). The device may then be attached to a window material that may have low loss at the wavelength of interest and can provide mechanical integrity.

For example, loss can be reflection loss from surfaces, which may be controlled by the refractive index (e.g., deviation from that of air, which is n=1). Another example of loss may be bulk absorption in the substrate. In some embodiments, the two losses are equal or less than 20%. In some examples, for mechanical integrity, the composite substrate can be at least 0.5 mm thick; as the array size increases, the thickness may be increased to 2 mm or greater.

Polymers such as poly 4-methyl pentene can have an absorption coefficient that is less than 0.05 cm$^{-1}$, which translates to a bulk absorption of 2.5% in a substrate that is 5 mm thick. The reflection loss at a surface adjacent to air (e.g., where incoming radiation initially passes) can be controlled by anti-reflective structures that can be molded into the polymer surface. The anti-reflective structures can include inorganic materials such as fused silica, quartz, and sapphire.

In some embodiments, if the substrate is sufficiently thin and may not sufficiently mechanically support a vacuum in the cavity, additional spacers may be used (e.g., to additionally support the substrate and the lid, in the pixel) for mechanical support and maintaining the distance between the absorber and the reflector.

As used herein, millimeter wave and terahertz are not limited to single digit quantities associated with these units, it is understood that "millimeter wave" may include wavelengths less than 1 millimeter or greater than 10 millimeter, and "terahertz" may include frequencies less than 1 THz or greater than 10 THz.

In some examples, the pixels 120 are disposed on surface 113 of the substrate 112. In some examples, the substrate 112 includes TFT circuitry (e.g., TFT circuitry that enables control and readout of sensor elements and is coupled to readout circuits) associated with pixel readout. In some examples, the substrate 112 may include non-TFT elements.

In some embodiments, the lid 114 comprises a surface 115, and the reflector 122 is positioned on the surface 115 (the surface of the lid facing the absorbers of pixels 120). In some examples, the reflector 122 is part of the lid 114. For example, the lid 114 redirects radiation to the pixels 120. In some embodiments, as illustrated in FIG. 1, the reflector 122 is attached to the surface of the lid 114. In some embodiments, the reflector is the lid. For example, the reflector is structurally part of the lid and is located on a surface of the lid. As another example, the lid is a reflective material. In some embodiments, the reflector is inside the lid (e.g., the lid allows radiation to pass and reach the reflector that is inside the lid). In some embodiments, the reflector 122 is positioned on the opposite side of the substrate 112 as the pixels 120 (and absorber). In some embodiments, the lid 114 is opaque to the incoming radiation. In some embodiments, the lid 114 provides a structural encapsulation for the MEMS device 100. In some embodiments, the lid 114 is a capping plate.

In some embodiments, the cavity 118 is in a vacuum. In some embodiments, the lid is configured to withstand the vacuum and present a hermetic barrier to maintain the vacuum. The lid should be otherwise opaque to radiation. In some embodiments, the lid includes a transparent dielectric layer to prevent corrosion during manufacturing and the pixel is designed for the electromagnetic properties of the transparent dielectric layer to optimize absorption.

In some embodiments, the lid is configured to withstand a vacuum in the cavity and present an effective hermetic barrier to maintain the vacuum. In some embodiments, the lid incorporates a transparent dielectric layer, which may advantageously provide a surface treatment to prevent corrosion during manufacturing. The electromagnetic properties of the dielectric layer are fully accounted for in the pixel design (e.g., absorption properties). For example, the pixel is designed for optimal absorption at a position that enables constructive interference between an incoming radiation and a directed radiation from a reflector.

In some embodiments, the substrate 112 and the reflector 122 are separated by a gap 126 related to the wavelength of the radiation. For example, if the reflector 122 is comprised of metal, radiation redirected from the reflector 122 can be 180 degrees out of phase from the incident radiation. In this example, the reflector 122 can be placed at a quarter wavelength away from the pixels 120 to allow the radiation to be absorbed at a point of constructive interference (e.g., the incoming radiation and the redirected radiation are optimally constructively interfering with each other at the pixel locations). In some examples, the reflector 122 can include a layer of metal with high conductivity in the THz frequencies of interest, with the layer at least several times thicker than the skin depth.

In some embodiments, the reflector comprises a plurality of reflectors each corresponding to a respective pixel (not shown). In some embodiments, the separation between a respective reflector and a respective pixel is dependent on a wavelength of the incoming radiation. For example, the MEMS device 100 may be configured to receive incoming radiation having two different wavelengths, and the MEMS device 100 may include two reflectors having two different separation distances between the respective reflector and the respective pixel (e.g., first separation at a quarter of a first wavelength and second separation at a quarter of a second wavelength).

In some embodiments, the spacers 116 separate the substrate 112 and the lid 114, as illustrated. In some embodiments, the spacers 116 may be formed from a sacrificial layer when the lid or the substrate is formed. After the formation of the lid or the substrate, material from the sacrificial layer is removed to form the spacers 116. It is understood that the spacer 116 may be formed from other materials and/or other methods (exemplary methods of manufacturing spacers can be found in International Appln No. PCT/US2019/022338, the entirety of which is incorporated herein by reference).

In some embodiments, the spacers 116 can include two layers of dissimilar materials. This may be advantageous at wavelengths (e.g., the THz bands) where a thick layer of sacrificial material is impractical for creating the spacers 116. In some embodiments, one layer is a conductive layer (e.g., a metal layer) and the other layer is a dielectric layer. The top layer can have considerably higher tensile stress than the lower layer. This may advantageously allow the spacer to launch upward to neutralize the composite stress gradient when the structure is released from the sacrificial layer that held elements in place during the manufacturing process. The amount of stress difference coupled with the spacer length can result in a net displacement beyond the original sacrificial gap thickness.

As an exemplary advantage, a thinner sacrificial layer can be used to form the spacers 116 in place of a thicker sacrificial layer. This may be desirable for camera sensors operating in THz frequencies because the required sacrificial layer thickness may be large and costly.

In some embodiments, the spacers can be created by etching with a mask. In some embodiments, the spacers can be molded or etched based on the structural material used for lid.

Figure 2:
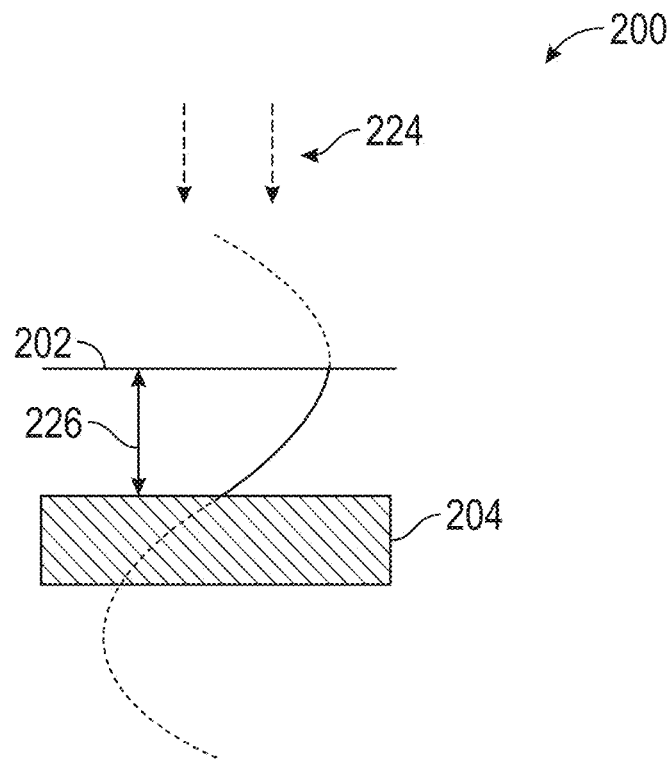
FIG. 2 illustrates elements of a MEMS device, in accordance with an embodiment.

FIG. 2 illustrates elements of a MEMS device 200, in accordance with an embodiment. In some embodiments, FIG. 2 is representative of a separation (e.g., gap 226) between an absorber 202 (e.g., an absorber included in one or more of pixels 120) and a reflector 204 (e.g., reflector 122) in a MEMS device (e.g., MEMS device 100). As illustrated, radiation 224 may enter the MEMS device 200 in a direction from the absorber 202 to the reflector 204, then reflect from the reflector 204 back toward the absorber 202.

In some embodiments, the MEMS device 200 is a bolometer device configured to absorb radiation and measure a temperature associated with the radiation. In these embodiments, the absorber 202 may be thin to reduce the thermal capacity of the pixel (e.g., thin enough to yield a desired pixel response time). A thin absorber 202 may reduce pixel response time to the incoming radiation in order to support faster frame update rates. For example, if the absorber is a metal with a resistivity p, the resistivity may be divided by a thickness to determine a sheet resistance, which can be matched to the impedance of free space (e.g., 377 ohms). As a specific example, the fill factor (FF), thickness (t) and resistivity (p) can be combine according to p/(txFF)=377 ohms to produce a desired effective impedance of the absorber. The gaps, slots or voids that reduce the fill factor should be smaller than the wavelengths of interest, such that the effect can be averaged over the area of the pixel. By choosing an appropriate fill factor in the range of 2% to 50%, the thermal capacity can be reduced while also increasing the film thickness into the range of 10 to 200 nm that may be more compatible with high volume manufacturing.

As yet another example, Ti can have the following characteristics at 100 μm wavelength—(n, k)=(73, 108). This may correspond to a resistivity value of $3.8 \times 10^{-7}$ ohm-m. A thickness value of 1 nm would determine a sheet resistance of the material accordingly. In some embodiments, a metal with higher resistivity would correspond to increasing thickness. In some embodiments, the absorber can have structure that is smaller than the wavelength of the incoming radiation.

When the absorber 202 is made thin in this way, the incoming radiation 224 may not be completely absorbed in a single pass. The reflector 204 is used to redirect the partially transmitted radiation (e.g., the unabsorbed incoming radiation). With herein described phase differences between the absorber and reflector (e.g., proper separation between the absorber and the reflector), absorption of radiation can be interferometrically enhanced (e.g., the incoming radiation and the unabsorbed radiation constructively interferes at the absorber position). In some embodiments, the radiation transmitted through the absorber (e.g., radiation unabsorbed when the incoming radiation initially enters the MEMS device) and the radiation directed from the reflector have a phase difference, and the separation between the absorber and the reflector corresponds to a second phase (e.g., a separation at a fraction of the radiation wavelength). The absorption of the radiation can be enhanced (e.g., the radiation transmitted through the absorber and the radiation directed from the reflector constructively interfere) when twice the second phase added to the phase difference equal one period (e.g., zero degree, 360 degrees) of the radiation.

In some embodiments, the reflector includes an electrical conductor (e.g., metal). In such embodiments, the difference between the first phase and the second phase may advantageously be 180 degrees, such that the gap between the absorber and the reflector is one quarter wavelength long (e.g., corresponding to 90 degree phase). In this example, if the incoming radiation is in THz frequencies, then the separation between the absorber and the reflector can be in a range 7.5 to 250 μm (a quarter wavelength of exemplary THz radiation). It is understood that the disclosed MEMS device may include reflectors at different separations from the absorbers to enhance the absorbed radiations at different wavelengths.

Figure 3:
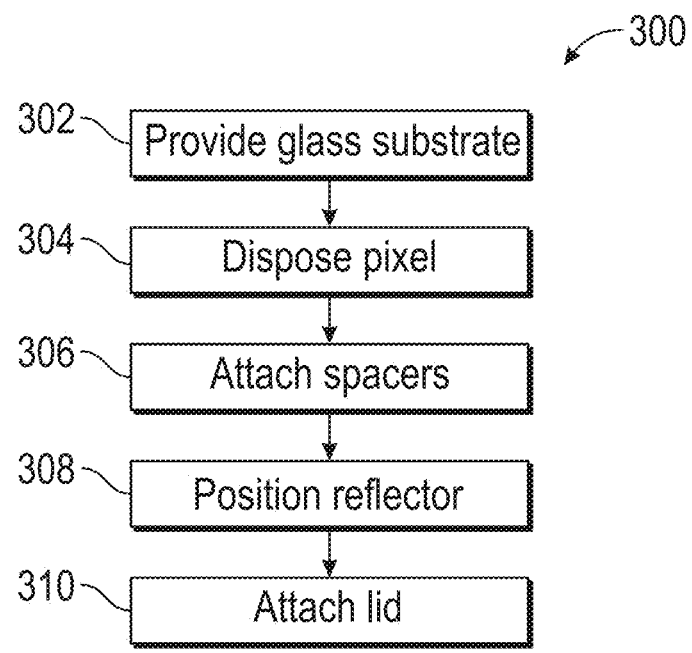
FIG. 3 illustrates a method of manufacturing a MEMS device, in accordance with an embodiment.

FIG. 3 illustrates a method 300 of manufacturing a MEMS device, in accordance with an embodiment. It is understood that the order of steps in the methods disclosed are not meant to be limiting. In some embodiments, the order of steps may be different, additional steps may be performed, or combination of the steps may be different to manufacture or operate the disclosed devices or systems.

The method 300 includes step 302, providing a glass substrate comprising TFT circuitry. The glass substrate can be configured to pass radiation from a first surface of the glass substrate through a second surface of the glass substrate. For example, the provided substrate may be substrate 112 in MEMS device 100. In some embodiments, the method 300 begins with step 302.

The method 300 includes step 304, disposing a pixel comprising an absorber to detect the radiation on the second surface of the glass substrate. For example, the provided substrate may be pixels 120, absorbers 202, or absorbers 502 disposed on surface 113 of substrate 112 in MEMS device 100. In some embodiments, step 304 follows step 302.

The method 300 includes step 306, attaching spacers to the second surface of the glass substrate. For example, the spacers 116 are attached to a second surface of substrate 112 in MEMS device 100.

The method 300 includes step 308, positioning a reflector on a lid. The reflector can be configured to direct the radiation to the absorbers. For example, reflectors 122, 204, 402, or 504 are positioned on the lid 114.

The method 300 includes step 310, attaching the lid to the spacers. For example, the lid 114 are attached to spacers 116 in MEMS device 100.

In some embodiments, the method 300 further comprises forming a cavity defined by the spacers, the lid, and the second surface of the glass substrate. For example, cavity 118 is formed in MEMS device 100.

In some embodiments, the method 300 further comprises forming the spacers using material from a sacrificial layer. For example, spacers 116 may be formed using material from a sacrificial layer.

In some embodiments, the method 300 further comprises separating the reflector and absorber by one quarter of the wavelength of the radiation. For example, the reflector 122 or 204 can be separated from pixel 120 or absorbers by a quarter wavelength of an incoming radiation in MEMS device 100.

In some embodiments, positioning the reflector comprises positioning a plurality of reflectors, each corresponding to a respective pixel. For example, the reflector 122 or reflector 204 includes a plurality of reflectors, each corresponding to a respective pixel.

In some embodiments, the substrate includes one or more of fused silica and quartz and has a thickness in the range 50 to 200 μm. For example, the substrate 112 may include one or more of fused silica and quartz and has a thickness in the range 50 to 200 μm.

In some embodiments, the method 300 further comprises disposing a plurality of pixels on the second surface of the glass substrate. For example, pixels 120 can be disposed on surface 113 of substrate 112.

In some embodiments, the method 300 further comprises positioning the reflector on the lid. For example, reflector 122 or reflector 204 may be positioned on lid 114. In some embodiments, the reflector is the lid. For example, the reflector is structurally part of the lid and is located on a surface of the lid. As another example. the lid includes a reflective material.

In some embodiments, the method 300 further comprises positioning the reflector in the lid.

In some examples, it may be desirable to reduce the separation between the absorber and the reflector while enhancing the absorbed radiation. In some examples, the radiation may be incoming through a lid of the MEMS device. In these examples, the lid and the substrate may be separated by a sacrificial gap. For example, at THz wavelengths, the sacrificial gap having a quarter-wavelength length may be too difficult or costly to manufacture due to excessive thickness that cannot be supported by manufacturing processes. In some embodiments, an absorber to reflector separation may be shortened using a metasurface mirror included in the reflector. The metasurface can be designed to yield strong reflection with a desired phase. For example, the metasurface mirror is designed to direct the incoming radiation to the absorber and the redirected radiation has a desired phase shift. As used herein, a metasurface can be understood to be a planar structure which includes periodic subwavelength structures that resonantly couples to the electric, magnetic, or both components of the incident electromagnetic fields (e.g., the radiation).

Figure 4:
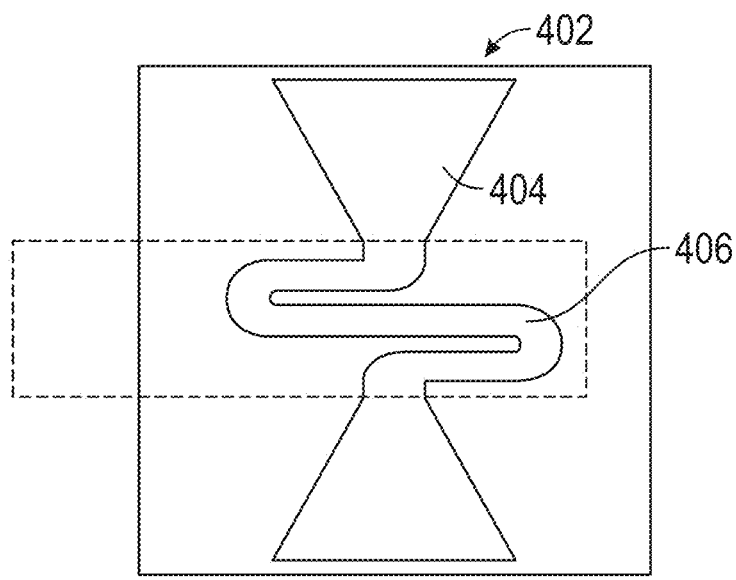
FIG. 4 illustrates elements of a MEMS device, in accordance with an embodiment.

FIG. 4 illustrates a metasurface mirror 402, in accordance with an embodiment. The metasurface mirror 402 includes electromagnetic structures comprising an array of antenna structures 404, with each microantenna terminated by a short section of transmission line 406 with an electrically shorted load. In these examples, the radiation being redirected (e.g., reflected) by the antenna can incorporate the phase of the transmission line 406 path in the antenna circuit. That is, the transmission line 406 may be tuned to yield the desired phase shift. In some embodiments, the electromagnetic structures are smaller than a wavelength of an incoming radiation. For example, the electromagnetic structures can be sized to achieve a desired phase shift.

The radiation transmitted through the absorber and the radiation directed from the reflector can have a phase difference, and the separation between the absorber and the reflector can be a distance associated with a second phase (e.g., a separation at a fraction of the radiation wavelength, a sacrificial gap). Therefore, metasurface mirror 402 can be designed such that the second phase is shorter than a quarter wavelength (e.g., to reduce the thickness of the sacrificial gap) of the radiation. As an exemplary advantage, costs of a MEMS device operating in THz wavelengths may be reduced while the absorbed radiation is enhanced, if the sacrificial gap between the absorber and the reflector is reduced using the metasurfaces 402.

As an example, the radiation transmitted through the absorber (e.g., radiation unabsorbed when the incoming radiation initially enters the MEMS device) and the radiation directed from the reflector have a phase difference, and the separation between the absorber and the reflector corresponds to a second phase (e.g., a separation at a fraction of the radiation wavelength). The absorption of the radiation can be enhanced (e.g., the radiation transmitted through the absorber and the radiation directed from the reflector constructively interfere) when twice the second phase added to the phase difference equal one period (e.g., zero degree, 360 degrees) of the radiation.

It is understood the illustrated metasurface mirror 402 is not limiting; other metasurface structures, configured to phase-shift an incoming radiation to a redirected radiation having a desired phase, may be implemented without departing from the scope of the disclosure.

In some embodiments, the reflector includes multiple metasurfaces 402 comprising electromagnetic structures configured for different electromagnetic polarizations. For example, metasurface antennas could be positioned at 90 degrees (or substantially 90 degrees) such that the antenna polarization is orthogonal (or substantially orthogonal). In such embodiments, the metasurface antennas may have transmissions lines separated from other polarization circuits, using an airbridge, for example. In some embodiments, metasurface antennas could be positioned at different angles to others within a metasurfaces array. For example, some metasurfaces may be positioned at 90 degrees while others are positioned at 45 degrees. In some embodiments, a metasurfaces array includes two or more orientations; the metasurfaces could be adjacent or in separate sections of the array.

Other methods may be used to reduce a separation between the absorber and the reflector while enhancing the absorbed radiation (e.g., to reduce spacer length and cost). Theoretically, a zero gap between the absorber and the reflector (e.g., the absorber is disposed on a surface of the reflector) would mean that the absorbed radiation is optimally enhanced at the surface of the reflector. However, if the MEMS device is a microbolometer device, having a zero gap would not be practical because a thermally isolating gap may be required between the bolometer absorber and the reflector (e.g., to thermally decouple the absorber from the reflector). Therefore, in such instances, a small but non-zero phase shift may be desired to thermally isolate the absorber and the reflector while minimizing the spatial separation between the absorber and the reflector. The disclosed metasurface mirror 402 and reflector 504 (described below) advantageously direct radiation transmitted through the absorber at the non-zero phase shift for microbolometer devices.

In some embodiments, the metasurface mirror 402 can used as a reflector or reflective surface of an illumination source, as described below. The metasurface mirror in an illumination source can be designed to yield a desired distance between an illumination wire grid and the reflector or the reflective surface, such that transmitted radiation and radiation redirected from the reflector or the reflective surface constructively interfere at a specific wire grid position.

Figure 5:
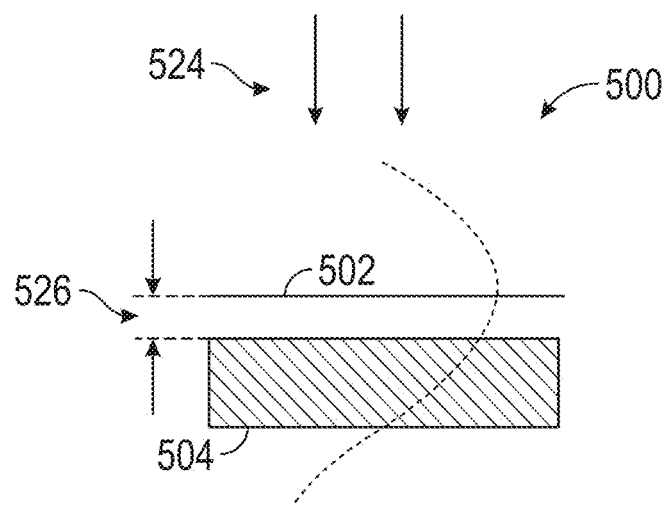
FIG. 5 illustrates elements of a MEMS device, in accordance with an embodiment.

FIG. 5 illustrates a magnetic mirror in a MEMS device 500, in accordance with an embodiment. In some embodiments, FIG. 5 is representative of a separation (e.g., gap 526) between an absorber 502 and a reflector 504 (e.g., magnetic mirror) in a MEMS device. As illustrated, radiation 524 may enter the MEMS device 500 in a direction from the absorber to the reflector. In the MEMS device 500, a small but nonzero phase shift can be designed into the structure by adjusting the parameters of the reflector 504. For example, the reflector 504 is a high impedance conductor, and the impedance of the reflector 504 is adjusted to yield the desired nonzero phase shift. As illustrated, the impedance of the reflector 504 is adjusted to yield the desired phase shift such that radiation absorption is optimized (e.g., maximum of the interference peak) at a desired distance (e.g., gap 526) from the reflector surface.

Exemplary conductor materials that may be used in reflector 504 includes Al and its alloys (e.g., AlCu, AlSi, AlNd, AlSiCu), Ag, Au, Cu, Mo, and W. At THz frequencies, the refractive index and extinction coefficient are measured as opposed to conductivity and dielectric constant. In some embodiments, refractive index N and extinction coefficient K for the material should satisfy the inequality $((1-n)^2+k^2)/((1+n)^2+k^2)>0.95$. The inequality corresponds to a power reflectivity of a mirror made out of such metal in a vacuum.

The radiation transmitted through the absorber and the radiation directed from the reflector can have a phase difference, and the separation between the absorber and the reflector can be a distance (e.g., gap 526) associated with a second phase (e.g., a separation at a fraction of the radiation wavelength). Therefore, reflector 504 can be designed (e.g., the impedance of the reflector 504 can be adjusted) such that the second phase is a small nonzero phase (e.g., to thermally isolate the absorber from the reflector at a minimal distance, to reduce a thickness of a sacrificial layer). As exemplary advantage, costs of a MEMS device operating in THz wavelengths may be reduced while the absorbed radiation is enhanced, if a thickness of a sacrificial gap is reduced using the reflectors 504.

As an example, the radiation transmitted through the absorber (e.g., radiation unabsorbed when the incoming radiation initially enters the MEMS device) and the radiation directed from the reflector have a phase difference, and the separation between the absorber and the reflector corresponds to a second phase (e.g., a separation at a fraction of the radiation wavelength). The absorption of the radiation can be enhanced (e.g., the radiation transmitted through the absorber and the radiation directed from the reflector constructively interfere) when twice the second phase added to the phase difference equal one period (e.g., zero degree, 360 degrees) of the radiation.

It is understood the illustrated reflector 504 is not limiting; other reflector structures, configured to phase-shift an incoming radiation to a redirected radiation having a desired phase, may be implemented without departing from the scope of the disclosure.

In some embodiments, the reflector 504 can used as a reflector or reflective surface of an illumination source, as described below. The reflector 504 in an illumination source can be designed to yield a desired distance between an illumination wire grid and the reflector or the reflective surface, such that transmitted radiation and radiation redirected from the reflector or the reflective surface constructively interfere at a specific wire grid position.

In some embodiments, a method of manufacturing a microelectromechanical system includes providing a pixel comprising an absorber to detect radiation having a wavelength. For example, pixel 120 or absorber 202 or 502 is provided to MEMS devices 100, 200, or 500. In some embodiments, the method includes providing a plurality of pixels, each pixel comprising an absorber to detect the radiation.

In some embodiments, the method includes providing a reflector to direct radiation transmitted through the absorber. For example, the reflector 122, 204, or 504 is provided to direct radiation 124, 224, or 524 transmitted through the absorber.

In some embodiments, the method includes separating the reflector and the absorber by a distance associated with a second phase. For example, the reflector 204, 402, or 504 and the absorber may be separated by a phase less than a quarter wavelength.

In some embodiments, the directed radiation and the radiation transmitted through the absorber have a phase difference. In some embodiments, twice the second phase added to the phase difference equals zero or 360 degrees.

In some embodiments, providing the reflector further comprises providing a metasurface including electromagnetic structures. For example, metasurface 402 is included in a provided reflector.

In some embodiments, the electromagnetic structures are smaller than the wavelength and configured for electromagnetic polarization. For example, the electromagnetic structures include antenna structures 404 and transmission line 406.

In some embodiments, the metasurface is configured to direct the radiation transmitted through the absorber. For example, the metasurface 404 is configured to direct the radiation transmitted through the absorber.

In some embodiments, providing the reflector further comprises providing a high impedance conductor. For example, the provided reflector includes a high impedance reflector (e.g., reflector 504).

Figure 6:
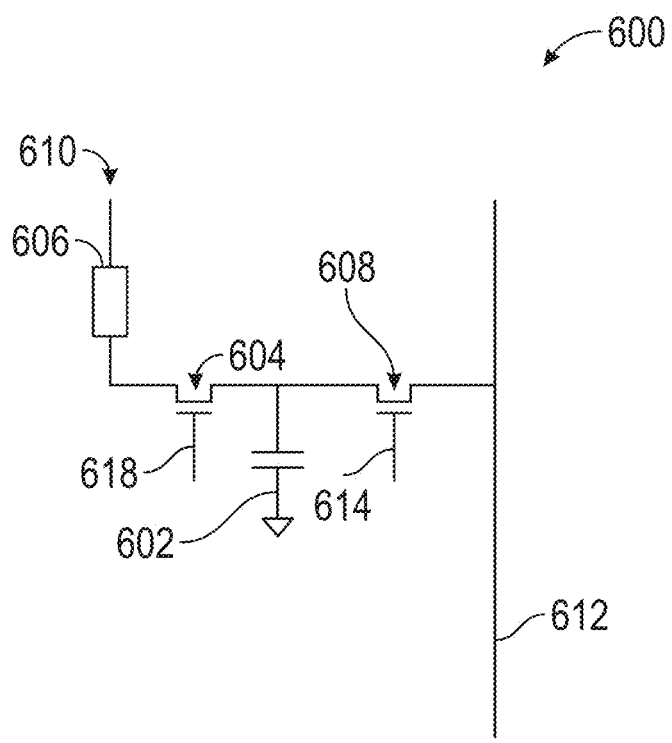
FIG. 6 illustrates a pixel of a MEMS device, in accordance with an embodiment.

FIG. 6 illustrates a pixel 600 of a MEMS device, in accordance with an embodiment. In some embodiments, pixel 600 is a pixel 120 of MEMS device 100 described above with respect to FIG. 1. As illustrated, the pixel 600 includes a local capacitor 602, a global sampling switch 604, a sensor 606, and a readout switch 608. In some embodiments, the switches may be implemented using TFTs in a glass substrate.

In some embodiments, the sensor 606 includes a bolometer absorber (having resistive properties) electrically coupled to a bias voltage 610. For example, the resistance of the sensor 606 can change in response to exposed radiation, and thus, a current through the sensor 606 is based on the resistance change and the bias voltage 610. In some examples, the absorbers in the pixels are configured to sense radiation in THz frequencies.

As an exemplary advantage, measurements from sensor 606 can be stored in a local capacitor 602 while a sensor from a different row is being readout, allowing portions of the sensor array to be readout at one time (e.g., the sensor array is being readout one row at a time). As another exemplary advantage, using a local capacitor 602 allows the sensed radiation to be continuously captured during a sampling time.

In some embodiments, the local capacitor 602 is configured to sample charge generated from the current of sensor 606. In some examples, the global sampling switch is electrically coupled to the sensor 606 and the local capacitor 602. In some embodiments, the global sampling switch is controlled by a globally addressed sampling signal 618; the globally addressed sampling signal is configured to electrically couple each pixel with a respective local capacitor by switching the plurality of global sampling switches to a conducting state. When the global sampling switch is in a conducting state (e.g., during a sampling time), the current from the sensor 606 charges the local capacitor 602; the sampled charge stored in the local capacitor 602 can be indicative of the radiation absorbed by the sensor 606.

It is understood that in a pixel array, more than one globally addressed sampling signal may exist. For example, a first globally addressed sampling signal is configured to electrically couple a first plurality of pixels with respective local capacitors by switching a first plurality of global sampling switches to a conducting state (e.g., at a first sampling time), and a second globally addressed sampling signal is configured to electrically couple a second plurality of pixels with respective local capacitors by switching a second plurality of global sampling switches to a conducting state (e.g., at a second sampling time).

When a sampling time has ended, the globally addressed sampling signal may be configured to electrically decouple the sensor 606 and the local capacitor 602 by switching the plurality of global sampling switches to a non-conducting state. The sampled charge in the local capacitor 602 may be readout after a sampling time has ended. The sampled charge may be readout by using the readout switch 608.

In some embodiments, the readout switch 608 is electrically coupled to the local capacitor 602 and the column 612. In some embodiments, the plurality of readout switches and the plurality of local capacitors are arranged in rows, each row associated with a row address. In some embodiments, the readout switch is controlled by a row address signal 614; the row address signal 614 is configured to electrically couple a local capacitor to a respective column by switching the readout switch to a conducting state. When the readout switch is in a conducting state (e.g., during a readout time), the current from the local capacitor 602 discharges to column 612 to elements of a sensor readout circuit (e.g., CTIA, ADC) (exemplary methods of readout circuit design and manufacturing can be found in PCT Application No. PCT/US2019/027982, the entirety of which is incorporated herein by reference).

In case the pixel becomes unwieldy in its size, especially as the pixel size dictates the thermal response time, some embodiments subdivide a pixel (e.g., pixel 600) into smaller subpixel bolometers with each subpixel made smaller than the composite so as to allow faster thermal response times. In some embodiments, the subpixel comprises a cluster of pixels. Referring to pixel 600, the sensor 606 can include a plurality of absorbers electrically coupled to the bias voltage 610 and the global sampling control switch 604. In these examples, the local capacitor 602 can be configured to sample a total pixel charge corresponding to the sub-pixels of the corresponding pixels (e.g., the currents associated with the sub-pixels charge the local capacitor 602 during a sampling time). As an exemplary advantage, dividing a pixel into sub-pixels can advantageously decouple the thermal response time from that of an entire pixel.

Figure 7:
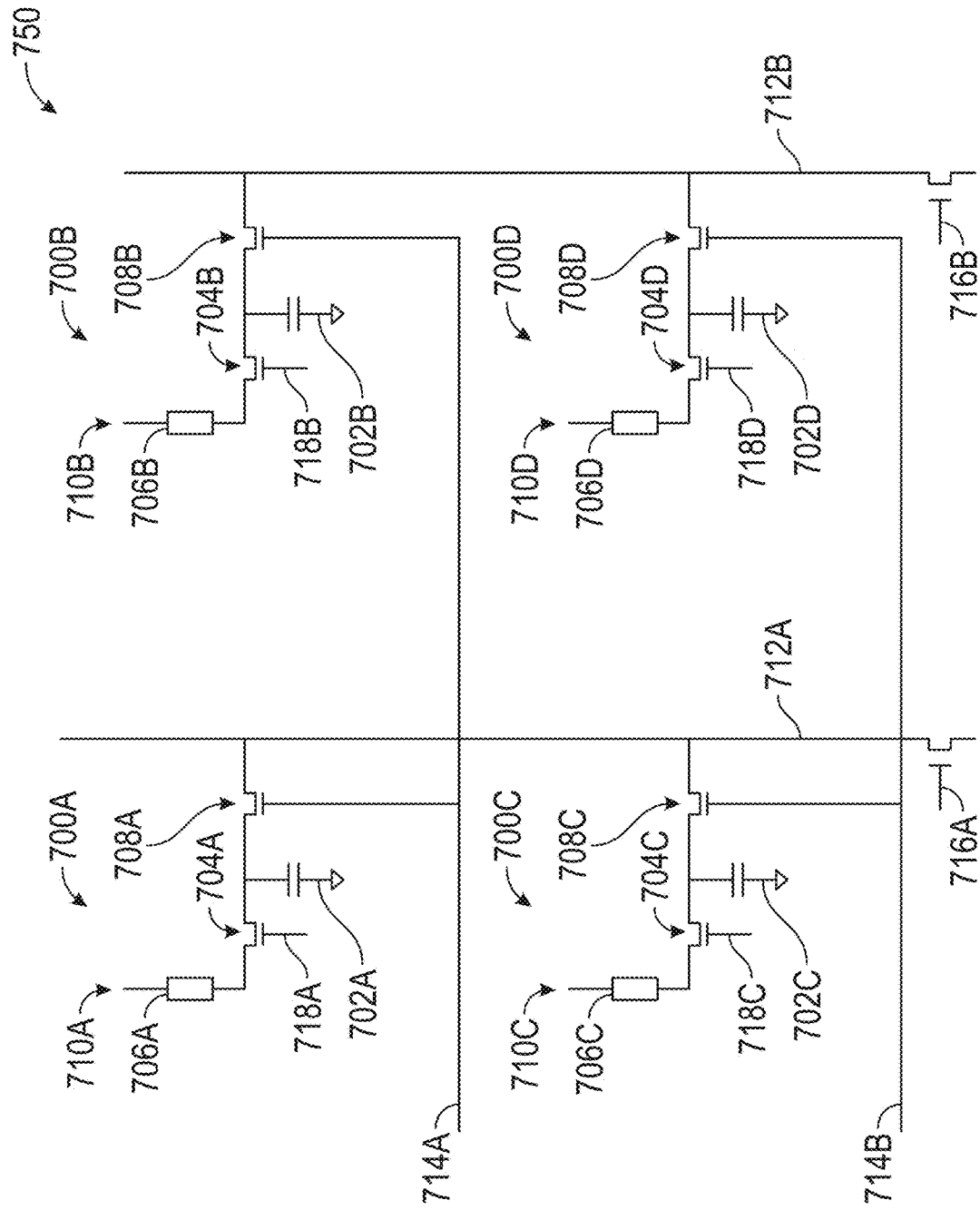
FIG. 7 illustrates a pixel array of a MEMS device, in accordance with an embodiment.

FIG. 7 illustrates a pixel array 750 of a MEMS device, in accordance with an embodiment. For example, the pixel array 750 is a schematic representation of a THz bolometer array on a glass substrate (e.g., pixels 120 included in a pixel array of the MEMS device 100). The pixel array includes pixels 700A-700D, each of which can be substantially similar to pixel 600, as described with respect to FIG. 6. Each pixel includes a unique address comprising a unique combination of the row address and the column address. Each row address can correspond to a row address signal 714, and each column address can correspond to a column address signal 716. Unique combinations of row address and column address signals can determine readout access for a particular pixel.

In some examples, the pixel array may be readout by rows. For example, after total charges from the plurality of sensors have been sampled, a first row address signal (e.g., signal 714A) associated with a first row (e.g., row including pixels 700A and 700B) is configured to electrically couple a first plurality of local capacitors (e.g., local capacitors 702A and 702B) with respective columns (e.g., pixel 700A to column 712A, and pixel 700B to column 712B) by switching a first plurality of readout switches (e.g., switches 708A and 708B) to a conducting state (e.g., at a first row time), and a second row address signal (e.g., signal 714B) associated with a second row (e.g., row including pixels 700C and 700D) is configured to electrically couple a second plurality of local capacitors (e.g., local capacitors 702C and 702D) with respective columns (e.g., pixel 700C to column 712A, and pixel 700D to column 712B) by switching a second plurality of readout switches (e.g., switches 708C and 708D) to a conducting state (e.g., at a second row time). In some examples, the columns 712 may be read at a same readout time. In some examples, the columns 712 may be read one at different readout times.

Although four pixels are used for the exemplary pixel array, it is understood that a pixel array can include any number of pixels or sub-pixels.

As used herein, "a column of sensors or pixels" is a plurality of sensors or pixels included in an array of sensors, arranged along a first dimension of the array, and bounded by boundaries of the array. Each sensor of the plurality sensors belongs to a unique row along a second dimension of the array. For example, as illustrated in FIG. 7, the pixels 700A-700D are spatially arranged by vertical columns of sensors (e.g., columns 712A to 712B).

Figure 8:
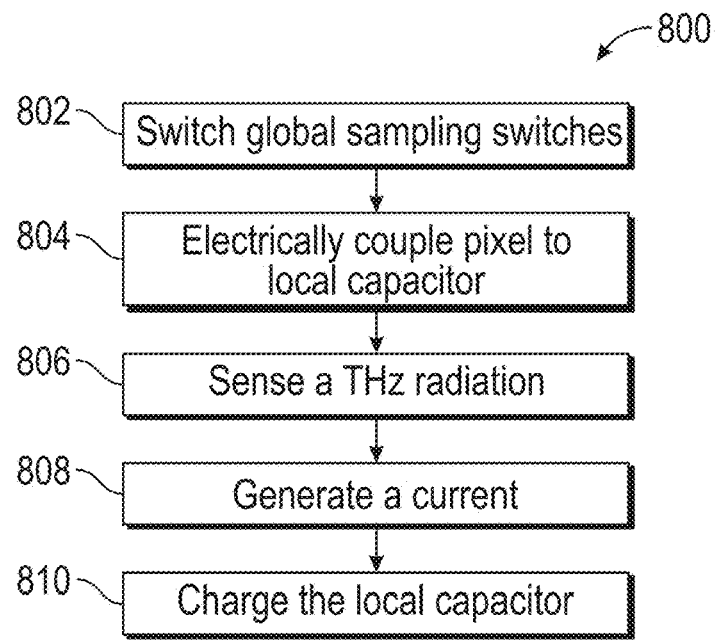
FIG. 8 illustrates a method of operating a MEMS device, in accordance with an embodiment.

FIG. 8 illustrates a method 800 of operating a MEMS device, in accordance with an embodiment.

In some embodiments, a MEMS includes a plurality of pixels, a plurality of local capacitors, and a plurality of global sampling switches each electrically coupled to a respective pixel, a respective local capacitor, and a globally addressed sampling signal, as described with respect to FIGS. 6 and 7.

In some embodiments, the method 800 includes step 802, switching, with the globally addressed sampling signal, the plurality of global sampling switches to a conducting state. For example, the global sampling signal 618 or 718 switches on the respective global sampling switches 604 or 704.

The method 800 includes step 804, electrically coupling each pixel to the respective local capacitor. For example, a pixel 600 or 700 is coupled to a respective local capacitor 602 or 702 after the global sampling signals 618 and 718.

The method 800 includes step 806, sensing, with the plurality of pixels, a radiation in terahertz frequencies. For example, a sensor 606 or 706 senses radiation in terahertz frequencies.

The method 800 includes step 808, generating a current at each pixel based on the sensed radiation and a bias voltage. For example, in response to the radiation, a resistance of the sensor 606 or 706 changes and a current is generated based on the bias voltage 610 or 710 value.

The method 800 includes step 810, charging the respective local capacitor with the current. For example, the local capacitor 602 or 702 is sampling a sensor measurement by charging the local capacitor with the generated sensor current.

In some embodiments, the microelectromechanical system further comprises a plurality of readout switches, the plurality of readout switches and the plurality of local capacitors are arranged in rows, each row associated with a row address, as illustrated with respect to FIG. 7.

In some embodiments, each readout switch is electrically coupled to a respective local capacitor, a column associated with a column address and electrically coupled to readout circuitry, and a respective row addressing signal. For example, a readout switch 608 or 708 is electrically coupled to a local capacitor 602 or 702, a column 612 or 712, and a row address signal 614 or 714.

In some embodiments, each pixel includes a unique address comprising a unique combination of the row address and the column address. For example, to access one of pixels 700A-700D, a unique combination of activation of row address and column address signal may be required.

In some embodiments, the method 800 includes switching, with the respective row addressing signal, a readout switch to a conducting state, electrically coupling the respective local capacitor to a respective column, and discharging the respective local capacitor to the respective column and the readout circuitry. For example, during a row readout, a row addressing signal 714 switches on a readout switch 708 and discharges a respective local capacitor 702 to a respective column 712 for readout.

In some embodiments, each pixel comprises sub-pixels, and the method 800 includes sampling, with each local capacitor, a total pixel charge corresponding to the sub-pixels of the corresponding pixel. For example a sensor 606 or 706 includes sub-pixels and a respective local capacitor 602 and 702 is configured to sample the charges generated from all of the sub-pixels.

Figure 9:
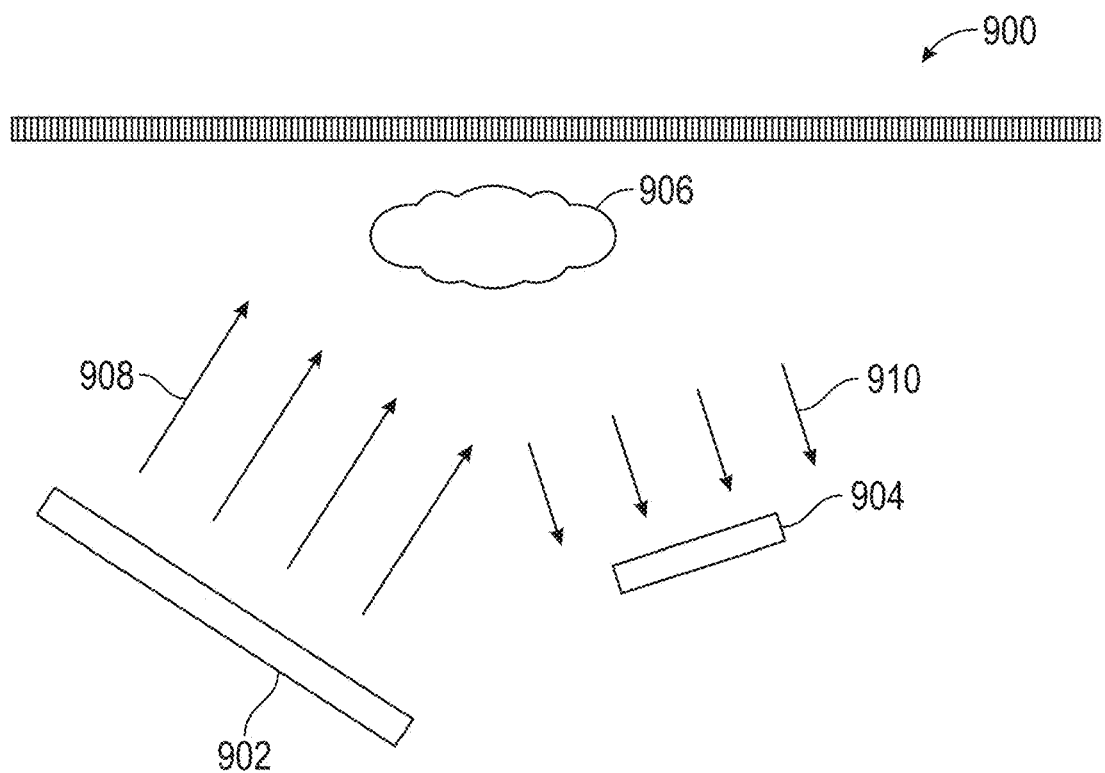
FIG. 9 illustrates a MEMS system, in accordance with an embodiment.

FIG. 9 illustrates a MEMS system 900, in accordance with an embodiment. In some embodiments, the MEMS system 900 includes an illumination source 902 and a camera sensor 904. In some embodiments, the illumination source 902 is configured to transmit radiation 908, and the camera sensor 904 is configured to detect a radiation 910. In some examples, the radiation detected by the camera sensor 904 comprises radiation transmitted by the illumination source 902 and reflected by object 906. In some embodiments, the camera sensor 904 is MEMS device 100, 200, or 500.

In some embodiments the illumination source 902 is a continuous or a modulated source; the continuous or modulated sources are generated using a voltage source, as described below. In some embodiments, an absorption background 908 is included in the MEMS system 900 to minimize reflections not directed from the object 906. In some embodiments, the distance of the object to the illumination source 902 and to the camera sensor 904 ranges from 1 to 30 m.

In some embodiments, the MEMS system 900 is a terahertz or millimeter imaging system. Images captured using the camera sensor 904 can be computationally combined with higher resolution imaging systems (e.g., non-terahertz or non-millimeter imaging system) to create composite images that are more clearly recognizable.

In some embodiments, the illumination sources can be placed at multiple locations to produce reflections at different angles, which may advantageously reduce the highly specular nature of reflections at longer wavelengths. When an object or scene is illuminated by a single source, specular reflection may requires that the detector or camera sensor to be within the cone of illumination of the source; the image may be dark otherwise. Including multiple sources in a hemispherical arrangement can advantageously minimize the dark regions thus improving image quality.

Figure 10A:
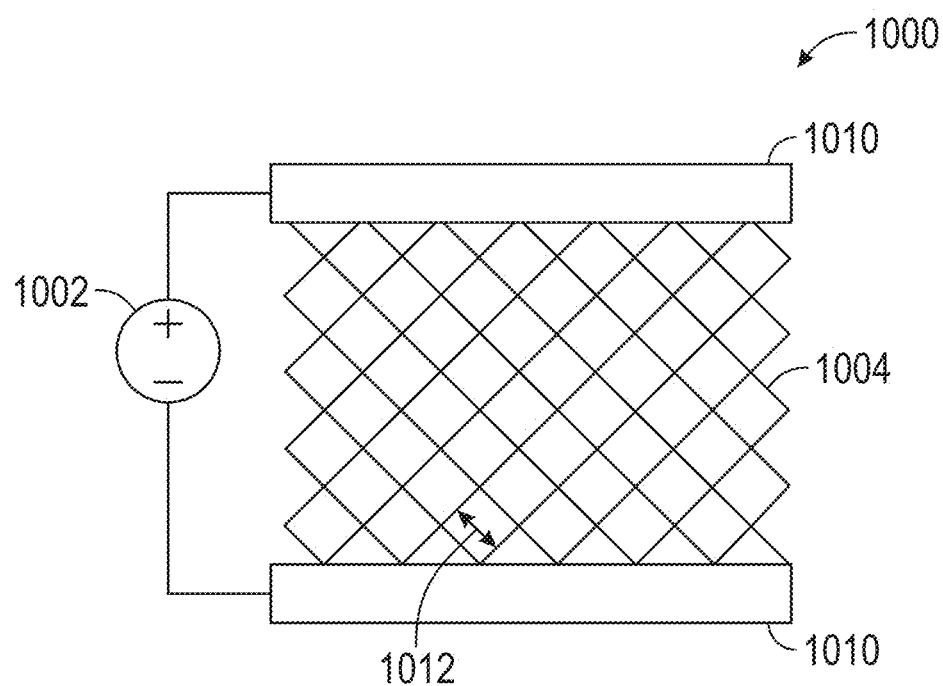
FIGS. 10A and 10B illustrate MEMS devices, in accordance with an embodiment.
Figure 10B:
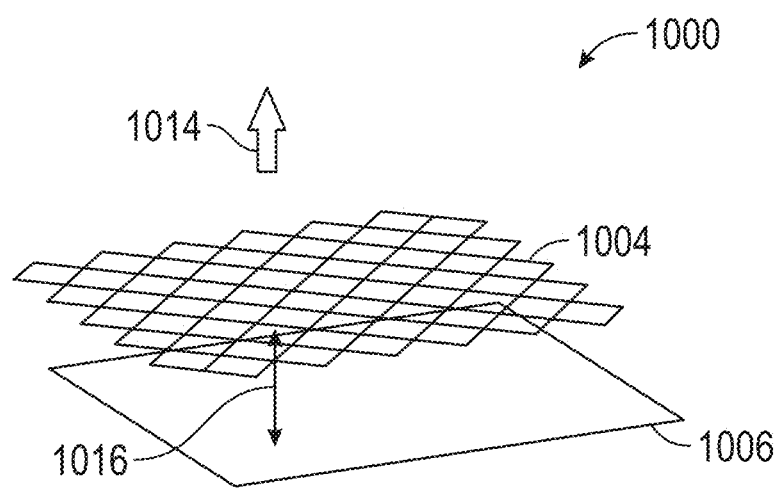

FIG. 10A illustrates a MEMS device 1000, in accordance with an embodiment. In some embodiments, the MEMS device 1000 is the illumination source 902 in MEMS system 900. The MEMS device 1000 includes a voltage source 1002, a wire grid 1004, and a reflective surface 1006 (as shown in FIG. 10B). The wire grid 1004 can be electrically coupled to the voltage source 1002 and can be configured to transmit radiation 1014 at a wavelength (e.g., wavelengths in the terahertz regime, wavelengths in a range of 0.1 millimeter to 3 millimeter). In some embodiments, the MEMS device 1000 includes spacers (not shown) that suspend the wire grid above the reflective surface 1006.

In some embodiments, the MEMS device 1000 includes electrical bus bars 1010 electrically coupled to the voltage source 1002 and the wire grid 1004. In some examples, the electrical bus bars 1010 provide a uniform electrical connection (e.g., a substantially same voltage across the electrical bus bar 1010 to yield a uniform voltage distribution or a uniform current) between the voltage source 1002 and the wire grid 1004 to create a more uniform radiation pattern across the wire grid 1004.

In some embodiments, the voltage source 1002 is configured to generate modulated voltage signals. The modulated voltage signals may allow the thermal source to be pulsed, which may lead to improvements in the signal-to-noise ratio of the camera sensor that uses such illumination. In some embodiments, the voltage source 1002 includes a plurality of pulsed sources configured to transmit radiations that alternates between high and low amplitudes (e.g., bright and dark). The voltage source of the illumination source can be operated continuously or modulated to improve signal-to-noise ratio for certain types of camera sensors or detectors. In some embodiments, pulsed voltage sources in conjunction with Correlated Double Sampling (CDS) circuits reduce the effects of low frequency drift and 1/f (flicker) noise. By taking a difference between the bright and dark frames (e.g., CDS), any slowly varying drift in the camera sensor (e.g., sensing an incoming radiation originating from a pulsed source) may be eliminated.

The wire grid 1004 can have a pitch 1012. As used herein, a pitch can be understood to refer to a repeating distance between adjacent wires of the wire grid 1004. In some embodiments, the pitch 1012 is less than or equal to 80% or four-fifths of the radiated wavelength. The wire grid pitch can be chosen to be slightly smaller (e.g., 80%, less than 100%) than the desired radiation wavelength in order to radiate with high efficiency at that wavelength. For example, for radiation at desired wavelengths longer than 600 μm, the pitch can be chosen to be 500 μm or smaller.

In these examples, the illumination source or power source may have an inverse characteristic of the transmission filter response. Thus, a high pass (shorter wavelength) filter will emit low pass (longer wavelength) radiation. In some embodiments, the wire grid 1004 generally functions as a high-pass (passes higher frequencies or shorter wavelengths) filter when it is used for transmission because it reflects or absorbs wavelengths that are longer than the wire pitch. Shorter wavelengths, such as visible and thermal radiation, can pass through the gaps between the wires. By using an illuminator that includes such transmission responses, the illuminator advantageously illuminates radiation in bands of interest and substantially does not illuminate radiation outside the bands of interest, and thus, electrical power driving heating elements of such illuminator can be reduced. For example, as described with respect to FIG. 11, the MEMS device 1000 can be configured to illuminate more millimeter wave radiation than radiation outside millimeter wavelengths. Because the radiation outside millimeter wavelengths include significant radiated power, by reducing radiation in these non-millimeter wavelengths, the power of the MEMS device 1000 is advantageously reduced.

In some embodiments, the wire grid 1004 has a diamond pattern. As used herein, a diamond pattern of wire grid 1004 can be understood to include adjacent parallel wires intersecting at an angle (e.g., 90 degrees), as illustrated. In some embodiments, the wire grid 1004 has a periodic pattern. As an exemplary advantage, the diamond pattern or other periodic patterns may promote uniform current density through all the wires and hence, uniform temperature across the wire grid. It is understood that other wire grid patterns can be used in the MEMS device 1000. For example, other wire grid patterns may include strips (either vertical or horizontal), meanders, zig-zags, and spirals, each with its own polarization and spectral properties. The patterns may not need to be periodic, as long as the open apertures are smaller than the shortest wavelength to be emitted.

In some embodiments, metal strips instead of metal grids may be used to produce linearly polarized radiation (e.g., polarized parallel to the stripes). Other repeated structures such as dots, circular and rectangular loops may be used in place of the wire grid. These discrete structures may be a resonant bandstop nature, compared to the high pass characteristic of the continuous wire grid or stripes. These resonant characteristics can be used to further narrow the bandwidth of the radiation.

In some embodiments, the surface impedance (e.g., sheet resistance) of the wire grid 1004 matches an impedance of the medium in which the radiation is transmitted. This may advantageously increase power of the transmitted radiation. For example, the wire grid 1004 can be designed to match the impedance of free space at 377 ohms. In such embodiments, the impedance of the wire grid 1004 can follow:

$$\frac{\rho}{t \times FF} = 377 \Omega \quad (1)$$

Wherein FF is the fill factor of the wire grid 1004, t is the thickness of the wire grid 1004, and p is the resistivity of the wire grid 1004 (e.g., resistivity of the wire grid material). For example, with a wire width of 5 µm at a pitch of 500 µm, the fill factor is $$\frac{(500^2 - 495^2)}{500^2} = 2\%.$$

For nichrome, the wire grid has a resistivity of about $1 \times 10^{-6}$ ohm-m.

Thus, a wire grid thickness of 130 nm can be used to match the impedance. Therefore, for a desired material and at desired radiation wavelengths, a thickness of the wire grid can be determined for impedance matching between the wire grid and a transmitting medium (e.g., free space).

In some embodiments, the MEMS device 1000 can include a wire grid 1004 (e.g., an absorbing layer) that is impedance matched to that of free space with a distance (e.g., quarter wavelength, a distance that causes constructive interference at the wire grid position) to a reflector (e.g., reflective surface 1006). The wire grid (e.g., absorbing layer) can be heated to a temperature, such that the MEMS device can operate as a blackbody source. Undesired parts of the blackbody spectrum may be limited by using the disclosed wire grid 1004 at a distance (e.g., quarter wavelength, a distance that causes constructive interference at the wire grid position) from the reflector and thus, modifying an emissivity of the structure.

The wire grid 1004 can comprise different material for desired mechanical, electrical, or thermal properties. For example, a thicker wire grid can provide increased mechanical strength, if desired. In such embodiments, the wire grid 1004 can comprise one or more of a conductive oxide (e.g., ITO, IZO, ZnO), conductive nitride (e.g., TiN, AlN), and silicide, which have lower conductivity (e.g., a thicker wire is required to achieve a same conductivity as higher conducting materials). As another example, a higher conducting material (e.g., chrome and aluminum) may be used for the wire grid 1004, and stronger mechanical support may be designed to support the wire grid 1004. Therefore, in some embodiments, the MEMS device 1000 includes a wire grid support (e.g., below the wire grid) that includes a thermally insulating material (e.g., $SiO_2$).

In some embodiments, the wire grid 1004 is annealed. If the wire grid 1004 is made of metal, the wire grid 1004 can have a higher coefficient of thermal expansion (CTE) than the substrate. Thus, when the wire grid is operated at elevated temperatures, it will expand with respect to the substrate. To maintain the integrity of the suspended wire grid, the wire grid can be slightly tensile at operating temperature. This can be accomplished by annealing the wire grid 1004 at higher than operating temperature during the fabrication process such that it will cool to the adequate tensile stress at room temperature.

FIG. 10B illustrates elements of the MEMS device 1000 in an alternative view. As described, the MEMS device 1000 includes a reflective surface 1006. In some embodiments, the reflective surface 1006 is substantially similar to reflector 122 in MEMS device 100. For example, the reflective surface 1006 includes an electrically conductive material. In some embodiments, the MEMS device 1000 includes spacers that suspend the wire grid above the reflective surface 1006.

In some embodiments, the reflective surface 1006 and the wire grid 1004 are separated by a distance 1016 of a fraction of a wavelength. The wavelength can be the radiation wavelength of the design. In some example, the wire grid 1004 and the reflective surface 1006 are separated by a quarter wavelength of the radiation to optimize the constructive interference of the transmitted radiation at the wire grid. The reflective surface can create a standing wave that has an antinode at a distance one quarter-wavelength from the wire grid.

In some embodiments, the reflective surfaces 1006 include metasurface mirror 402, as described with respect to FIG. 4, configured to redirect an incoming radiation at a designed phase. As discussed with respect to FIG. 4, the metasurface mirrors in reflective surface 1006 can be designed to yield a desired distance 1016 between the wire grid 1004 and the reflective surface 1006, such that transmitted radiation and radiation redirected from the reflective surface 1006 constructively interfere at a specific wire grid position.

In some embodiments, the reflective surfaces 1006 include reflector 504, as described with respect to FIG. 5, configured to redirect an incoming radiation at a designed phase. As discussed with respect to FIG. 5, the reflector 504 in reflective surface 1006 can be designed to yield a desired distance 1016 between the wire grid 1004 and the reflective surface 1006, such that transmitted radiation and radiation redirected from the reflective surface 1006 constructively interfere at a specific wire grid position.

In some embodiments, the reflective surface 1006 includes a distributed mirror such that the quarter wave condition can be satisfied for a range of wavelengths. This may advantageously provide for a broader reflection bandwidth. For example, a first mirror can be a shorted antenna resonant at a first wavelength corresponding to a first quarter wave gap, and below the first mirror, there can be a second antenna tuned to a second wavelength corresponding to a second quarter wavelength gap; because the second antenna is further away from the absorbers than the first antenna, the second wavelength is longer than the first wavelength.

Figure 11:
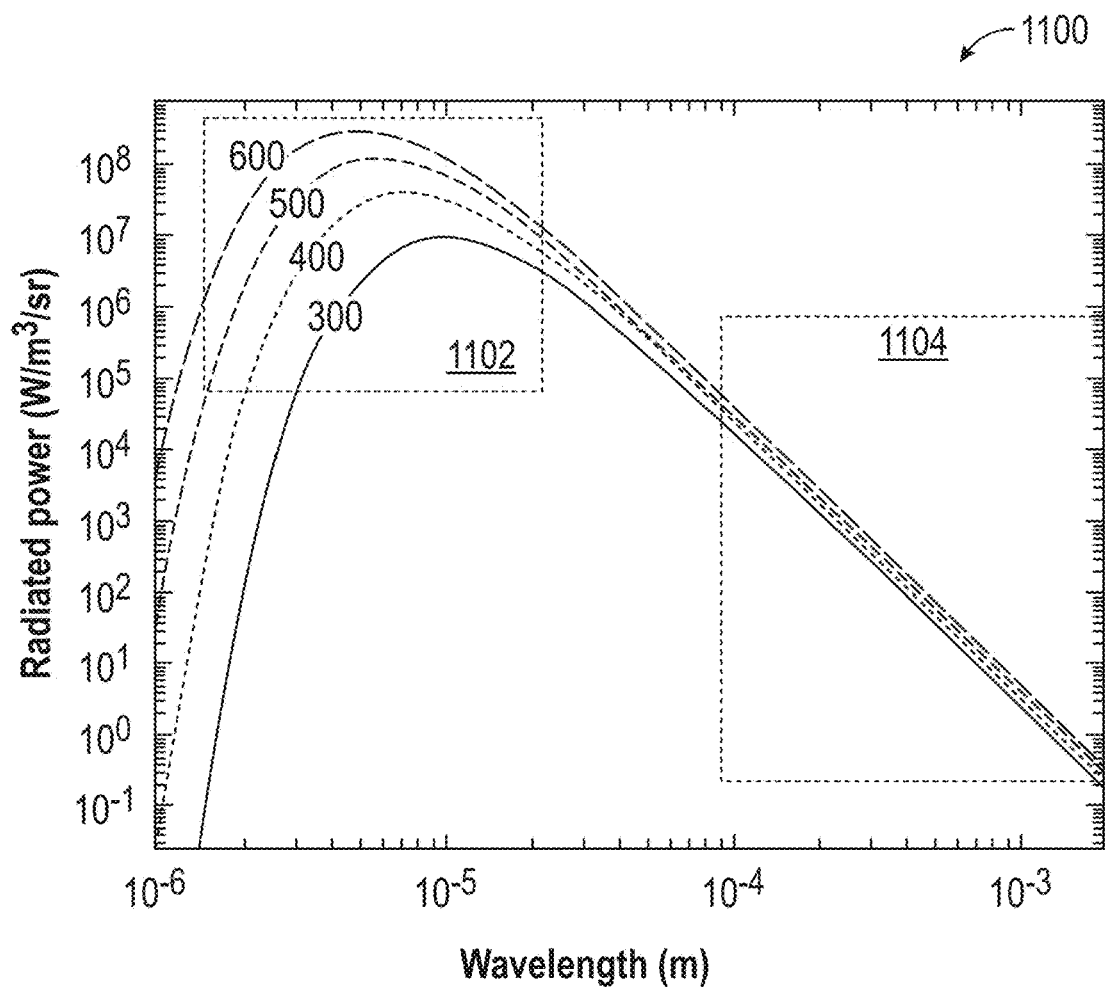
FIG. 11 illustrates a spectrum of radiation, in accordance with an embodiment.

FIG. 11 illustrates a spectrum of radiation 1100, in accordance with an embodiment. When the wire grid (e.g., wire grid 1004) is powered up by the electric source, it heats up and emits radiation according to the Planck blackbody radiation spectrum, as shown in FIG. 9. At operating temperatures from 300 to 600 K, most of the blackbody radiation is in the infrared region (e.g., wavelengths 1 to 50 µm), as illustrated in box 1102. Therefore, a solid emitter source (e.g., a source that emits additional radiations from spectra beyond the millimeter wave regime) may be inefficient, if millimeter wave radiation is desired (e.g., a majority of power is wasted outside the band of interest), as illustrated in box 1104. In some examples, wavelengths corresponding to the box 1104 may include desirable radiation wavelengths for imaging Therefore, the disclosed illumination sources having a wire grid emitter can advantageously be more efficient in wavelengths of interest (e.g., longer than 100 µm) because reduced power is consumed outside the wavelengths of interest.

The filtering characteristic of the wire grid can also be understood by considering the effective fill factor of the wire grid at different wavelengths. Due to the wave nature of electromagnetic radiation, wavelengths much shorter than the feature size (the grid pitch in this instance) interact with the geometric fill factor. At wavelengths longer than the feature size, the sub-wavelength features are spatially averaged according to the fill factor. Hence, effective surface resistance can be used. As an exemplary advantage, when the effective surface resistance is impedance matched to the free space medium at the wavelength corresponding to the quarter-wave cavity, the radiation efficiency is close to 100%; a cascade of the Planck blackbody spectrum, the wire grid filter, and the quarter-wave cavity resonance contributes to such high radiation efficiency.

Therefore, for a given surface area, the illumination source can radiate at very high efficiency in the desired longer wavelength regime (e g, millimeter waves) while radiating at low efficiency according to the low fill factor at undesired shorter wavelengths (e.g., infrared waves) to reduce illuminator power.

In some embodiments, the radiation may need to be higher than the background, which may be room temperature (300 K). Heating the wire grid to 600 K increases the radiated power, as shown in FIG. 11. As such, in some embodiments, the wire grid 1004 is heated using electric current to 600K to increase the radiated power. It is understood other methods of heating the wire grid exist without departing from the scope of the disclosure.

At the longer wavelengths to the right side of the peak in the plot, the power is proportional to the absolute temperature (in K). For example, the power at 600 K is twice the background (e.g., 300K) or 0.025×2=0.051 W/m$^2$/sr within the 300 µm to 600 µm band of interest. The unit of Steradian (sr) is a unit of solid angle with a complete sphere subtending 4 TF sr. For comparison, at 600 K, a solid emitter source (e.g., a source that emits additional radiations from spectra beyond the millimeter wave regime) will radiate 2300 W/m$^2$/sr of total power. As discussed earlier, the solid emitter source can be inefficient and pumps excess heat into the surroundings. In contrast, using a wire grid having a 2% fill factor, the total power can be reduced to less than 50 W/m$^2$/sr (compared to 2300 W/m$^2$/sr using a solid emitter source) while retaining substantially a same amount of THz radiation. The amount of heat spread over a large wire grid area can be more easily managed compared to the heat generated by the solid emitter source.

Figure 12:
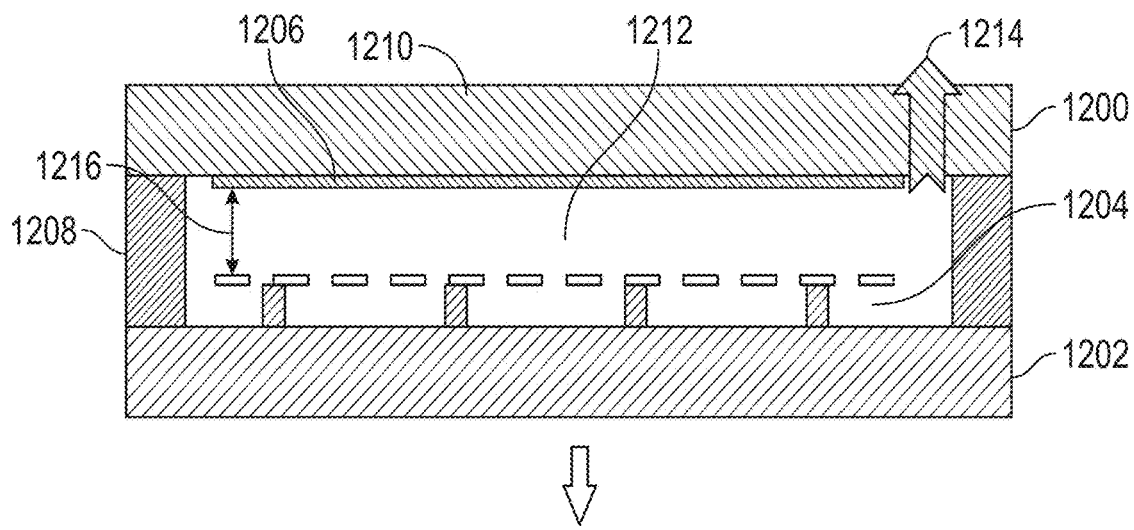
FIG. 12 illustrates a MEMS device, in accordance with an embodiment.

FIG. 12 illustrates a MEMS device 1200, in accordance with an embodiment. In some embodiments, the MEMS device 1200 includes a substrate 1202, wire grid 1204, reflector 1206, spacers 1208, and package encapsulation 1210. In some embodiments, the MEMS device 1200 is the illumination source 902 in MEMS system 900. In some embodiments, wire grid 1204 is substantively similar to wire grid 1004, and reflector 1206 is substantively similar to reflective surface 1006. In some embodiments, the wire grid 1204 and the reflector 1206 are separated by a distance 1216.

As illustrated, the wire grid 1204 is disposed on the substrate 1202. In some embodiments, the substrate 1202 is configured to pass radiation at desired wavelengths (e.g., the radiation transmitted by the wire grid 1204). For example, the substrate 1202 may be a glass substrate, as described herein. In some embodiments, the substrate 1202 is coated with an anti-reflective coating to optimize the transmitted radiation in the outgoing direction.

In some embodiments, the spacers 1208 is substantially similar to spacers 116 in MEMS device 100. In some embodiments, the spacers 1208 are formed with a sacrificial layer comprising a material different from the substrate.

In some embodiments, manufacturing of the MEMS device 1000 or 1200 starts with a substrate that can withstand the operating temperature (e.g., 600K). For example, the substrate may be glass or polyimides, such as Kapton. The wire grid can be deposited over a sacrificial layer with anchoring spacers. The spacers can be placed at a plurality of locations, which may advantageously keep the wire grid tightly suspended. In some embodiments, instead of using a sacrificial layer, the wire grid can be fabricated on a separate carrier substrate and then transfered onto the final substrate with spacers.

Due to heat loss through radiation, convection and conduction, the thermal conductivity between the wire grid and the substrate may determine the amount of power required to heat up the wire grid. In some embodiments, thermal conductivity is sufficiently low to increase power utilization efficiency (e.g., less than 1 W/K/m$^2$) but sufficiently high so that the thermal time constant of the grid is fast and temperature is modulated by a varying input current (e.g., at a rate of 0.1 Hz up to 10 kHz). A separate set of spacers can be engaged to make thermal contact with the wire grid and cool the wire grid down when needed; these spacers can be disengaged when the wire grid does not need to be cooled. With separate thermal conductivities for heating and cooling, the wire grid can be both heated and cooled quickly. This method of engaging a different set of spacers for heating and cooling can be used to modulate the temperature of the illumination source.

The pressure in the cavity may affect the conduction and convection of heat from the wire grid to the package (e.g., to the lid, to the encapsulation). If the pressure is too high (e.g., higher than larger than 10 mTorr), then a portion of the generated heat may go to the substrate and package through convection and may be dissipated to the environment. The heat loss may cause the illumination source to be inefficient and may need to be reduced by maintaining the low vacuum pressure.

To minimize heat transfer other than radiation from the wire grid to the surroundings, in addition to having insulating spacers, some embodiments encapsulate the wire grid in a vacuum chamber. The MEMS device 1200 can include a cavity 1212 defined by the wire grid 1204, the reflector 1206, and the spacers 1208. In some embodiment, a vacuum is maintained in the cavity 1212. For example, 1-10 W/K/m$^2$ of thermal conductivity may be desired; a vacuum of 1-1000 mTorr is maintained within the cavity to achieve this thermal conductivity range. In some embodiments, the vacuum is maintained by the packaging of MEMS device 1200. In some embodiments, the package encapsulation 1210 includes a vacuum port 1214, and the vacuum is maintained using a vacuum pump through the vacuum port. The cavity pressure can be monitored either by using a pressure gauge or by measuring the power dissipation in the wire grid.

The materials for the wire grid have a Temperature Coefficient of Resistance (TCR), which means that the resistance is a function of temperature within typical operating conditions. At the desired operating temperature, the wire grid may have a specific resistance that it was designed for. The power input to the wire grid is $$P = I^2 \times R \qquad (3)$$

Wherein I is input current and R is the resistance of the wire grid. When operating efficiently, the input power can be close to the total integrated power radiated at a given temperature. By creating a vacuum in the cavity and reducing conductive and convective paths in the cavity, less extra input power may be required to maintain a design temperature.

By creating a vacuum in the cavity and reducing conductive and convective paths in the cavity, the wire grid may be able to reach the design temperature and the wire grid can be protected against oxidation. This may advantageously reduce potential power loss through conduction and convection that may prevent the wire from even reaching its design temperature and may reduce the potential of damaging oxidation to the wire grid through the presence of air in the cavity.

Figure 13:
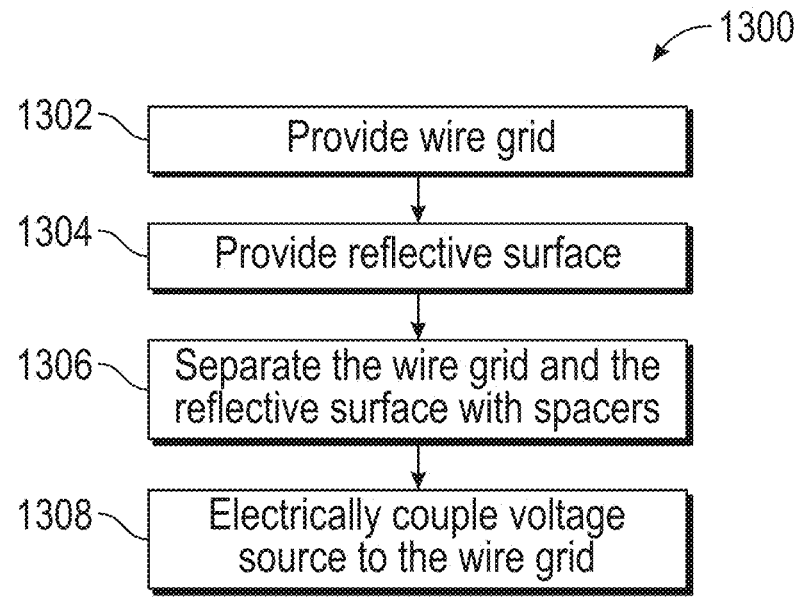
FIG. 13 illustrates a method of manufacturing a MEMS device, in accordance with an embodiment.

FIG. 13 illustrates a method 1300 of manufacturing a MEMS device, in accordance with an embodiment. The method 1300 includes step 1302, providing a wire grid configured to transmit radiation at a wavelength, and having a pitch at a first fraction of the wavelength. For example, wire grid 1004 or 1204 is provided to MEMS device 1000 or 1200.

The method 1300 includes step 1304, providing a reflective surface. For example, a reflective surface 1006 or 1206 is provide to the MEMS device 1000 or 1200.

The method 1300 includes step 1306, separating the wire grid and the reflective surface with spacers. The reflective surface can be separated from the wire grid by a second fraction of the wavelength. For example, wire grid 1004 or 1204 and reflective surface 1006 or 1206 are separated by a fraction of the wavelength (e.g., quarter wavelength, less than a quarter wavelength) in MEMS device 1000 or 1200.

The method 1300 includes step 1308, electrically coupling a voltage source to the wire grid. For example, voltage source 1002 electrically couples to the wire grid 1004.

In some embodiments, the wavelength is in a range of 0.1 millimeter to 3 millimeters. For example, the wavelength of the radiation is in a range of 0.1 millimeter to 3 millimeters.

In some embodiments, the first fraction is up to four-fifths and the second fraction is one quarter. For example, a wire pitch 1012 of the wire grid 1004 is up to four-fifths of the wavelength and the wire grid 1004 or 1204 and reflective surface 1006 or 1206 are separated by a quarter wavelength.

In some embodiments, the reflective surface comprises an electrically conductive material. For example, the reflective surface 1006 includes an electrically conductive material.

In some embodiments, a surface impedance of the wire grid matches an impedance of a medium in which the radiation is transmitted, and the surface impedance is based on a thickness of the wire grid. For example, a surface impedance of the wire grid 1004 matches an impedance of free space (e.g., 377 ohms).

In some embodiments, the wire grid comprises one or more selected from a conductive oxide, conductive nitride, and silicide. For example, the wire grid 1004 or wire grid 1204 may be formed from conductive oxide, conductive nitride, or silicide.

In some embodiments, the method includes annealing the wire grid. For example, the wire grid 1004 or wire grid 1204 is annealed.

In some embodiments, the method includes a wire grid support comprising a thermally insulating material. For example, a wire grid support is provided to support the wire gird 1004 or wire grid 1204.

In some embodiments, the method includes providing a second reflective surface separated from the wire grid by a third fraction of a second wavelength, wherein the wire grid is further configured to transmit radiation at the second wavelength. For example, a second reflective surface is included in the MEMS device 1000 or 1200 to transmit a radiation at a second wavelength.

In some embodiments, the method includes forming the wire grid in a diamond pattern. For example, the wire grid 1004 or wire grid 1204 is a diamond pattern. In some embodiments, the method includes forming the wire grid in a periodic pattern. For example, the wire grid 1004 or wire grid 1204 is in a periodic pattern.

Figure 14:
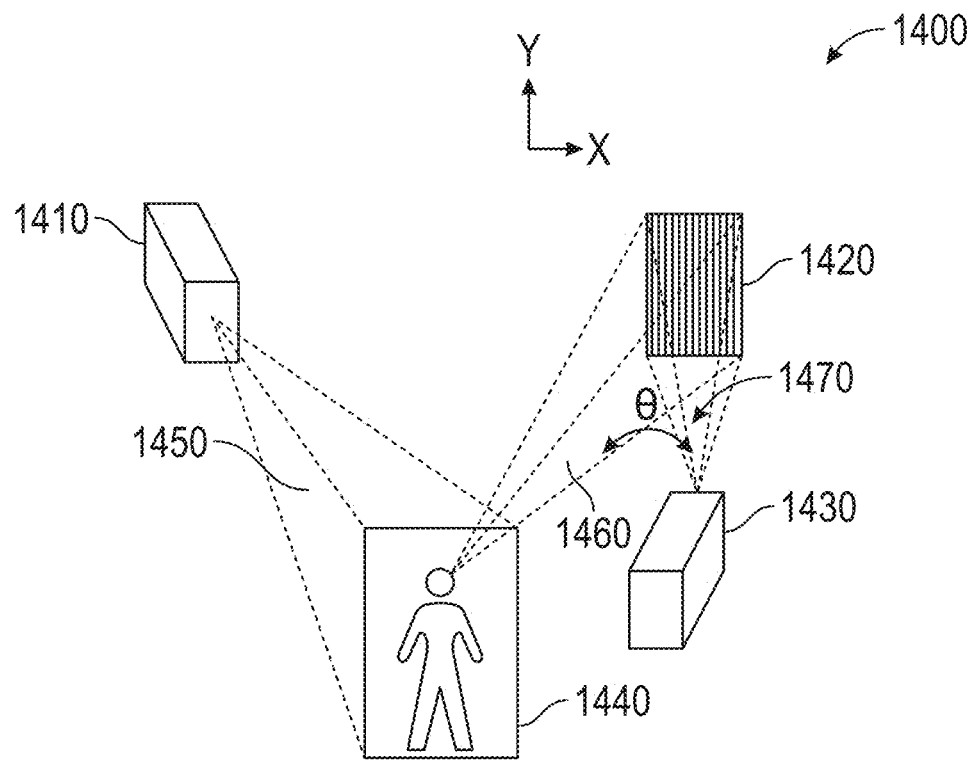
FIG. 14 illustrates an imaging system, in accordance with an embodiment.

FIG. 14 illustrates an imaging system 1400, in accordance with an embodiment. In some embodiments, the imaging system 1400 includes an illumination source 1410, a detector array 1420, and a local oscillator source 1430. In some embodiments, light sources associated with the illumination source 1410 and the local oscillator source 1430 may be derived from the same light source. In some embodiments, the illumination source 1410 and the local oscillator source 1430 have two separate light sources that are phase-locked with one another.

The detector array 1420 is configured to detect radiation scattered from the object (e.g., scattered wave 1460) and radiation 1470 from the oscillator source. In some embodiments, the detector array 1420 includes MEMS device 100, 200, 500, or 904 and is configured to detect radiation in the THz band.

In some embodiments, a portion of an output from a first source (e.g., the illumination source 1410) can be injected into a second source (e.g., local oscillator source 1430) to provide a stable phase relationship between the two sources. In some examples, the illumination source 1410 and local oscillator source 1430 may be oscillators which are included with transistor or diode amplifiers having high Q resonant cavities or lumped element resonators, such that a part of the output of one resonator can be injected into the other to perform injection locking. As an exemplary advantage, in the THz band, it may be beneficial to have two separate sources and use injection locking to induce mutual coherence. Mutual coherence between the local oscillator and the object waves can advantageously form a spatial carrier grating whose spatial frequency may be higher than the spatial frequency content of the object waves.

In some embodiments, the illumination source 1410 is configured to illuminate an object 1440 with radiation 1450 in terahertz frequencies such that the object scatters the radiation (e.g., scattered wave 1460). In some examples, the radiation 1450 can be suitably shaped, depending on the object 1440 to be detected, and be spread across the object 1440. The surface or subsurface of object 1440 can backscatter the incident radiation to create scattered wave 1460. The scattered wave 1460 can be described as emanating from a plurality of point scatterers, wherein $x_i$ is a point where the backscatter originates (e.g., from the object 1440). The field amplitude of the scatter is given by $$\sqrt{P_i} \frac{e^{jk|r-x_i|}}{\sqrt{2\pi}|r-x_i|} e^{j\varphi_i} \quad (4)$$

Where r is a coordinate vector indicating a position across the observation plane (e.g., the detector array 1420) and tri is the phase of the radiation 1460. $P_i$ is given by $$P_i = \frac{P_0 \lambda^2}{A_{Object}} \sigma_i \quad (5)$$

Where Po is power of the illumination source 1410, Aobject is the object area that is illuminated, and $\sigma_i$ is the scattering efficiency. From equation (4), the amount of scattered power that reaches the observation plane may be reduced due to $1/|r-x_i|^2$ loss. The complete object field amplitude distribution (without the local oscillator 1430) across the observation plane is given by $$E_{object} = \sum_i \sqrt{P_i} \frac{e^{jk|r-x_i|}}{\sqrt{2\pi}|r-x_i|} e^{j\varphi_i} \quad (6)$$

In THz direct detection sensors such as bolometers (e.g., detection array 1420), the output voltage for each detection element responds linearly to the incident optical power; phase information carried by the wave may be lost. For example, the power associated with equation (6) may be $|E_{object}|^2$; as such, phase information (e.g., phase φ) associated the scattered radiation 1460 may be lost when a local oscillator 1430 is not used.

In some embodiments, the local oscillator source 1430 is configured to illuminate the detector array 1420. As illustrated, the oscillator source can be configured to illuminate the detector array at an angle θ with respect to the scattered radiation. For example, if the local oscillator radiation 1470 has an amplitude of $$\sqrt{\frac{P_{LO}}{A_{obs}}}$$

wherein PLO is the local oscillator power and $A_{obs}$ is an area covered by the detector array 1420), the total field distribution (with the local oscillator 1430) can be expressed as follows $$E_{Total} = E_{object} + \sqrt{\frac{P_{LO}}{A_{obs}}} e^{jk\sin\theta x} \quad (7)$$

In this example, the two terms to the right of equation (7) are assumed to be mutually coherent and, thus, the temporal dependence may be suppressed. Mutual coherence between the local oscillator and the object waves can form a spatial carrier grating whose spatial frequency may be higher than the spatial frequency content of the object waves.

From equations (6) and (7), an intensity distribution, as observed by the detector array 1420, can be given by $$I(x, y) = \left| E_{object} + \sqrt{\frac{P_{LO}}{A_{obs}}} e^{jk\sin\theta x} \right|^2 = \quad (8)$$

$$|E_{object}|^2 + \frac{P_{LO}}{A_{obs}} + \sum_i \sqrt{\frac{P_{LO}}{A_{obs}} P_i} \frac{e^{jk|r-x_i|}}{\sqrt{2\pi}|r-x_i|} e^{j\varphi_i} e^{-jk\sin\theta x} + c.c.$$

The third term ($\Sigma_i \ldots$) on the right hand side in equation (8) correspond to the recovery of the coherent amplitude distribution of the object waves with an amplitude increase by a factor proportional to $$\sqrt{\frac{P_{LO}}{A_{obs}}}.$$

Accordingly, a power of the detected radiation (e.g., from equation (8)) is greater than a power of the scattered radiation (e.g., $|E_{object}|^2$, Therefore, an intensity distribution associated with the radiation includes the scattered radiation amplified by a gain $$\left( e.g., \sqrt{\frac{P_{LO}}{A_{obs}}} \right),$$

the gain is based on a power of an oscillator illumination and an area of the detector array.

As described above, using the imaging system 1400, an intensity distribution associated with the detected radiation includes information associated with the phase (e.g., phase φ). Therefore, an intensity distribution associated with the radiation advantageously includes a component (e.g., the third term from equation (8)) comprising the phase and the angle. By receiving an intensity distribution component that includes a phase of the scattered radiation, additional information about the object can be recovered and thus, the image of the object can be more accurate. In contrast, as discussed above, in an imaging system that does not use a local oscillator, phase information (e.g., phase φ) associated the scattered radiation may be lost.

The full intensity pattern as described by equation (8) is detected and digitized by an array of detector pixels having a density. For example, the pitch of the pixels may be made smaller than one half of the ratio of the wavelength to sin(θ) to satisfy the Nyquist criterion. The detected image can be processed by a digital Fourier transform to perform a spatial high pass filtering operation, suppressing low frequency components while leaving the complex image that is multiplied by the spatial carrier term.

Figure 15:
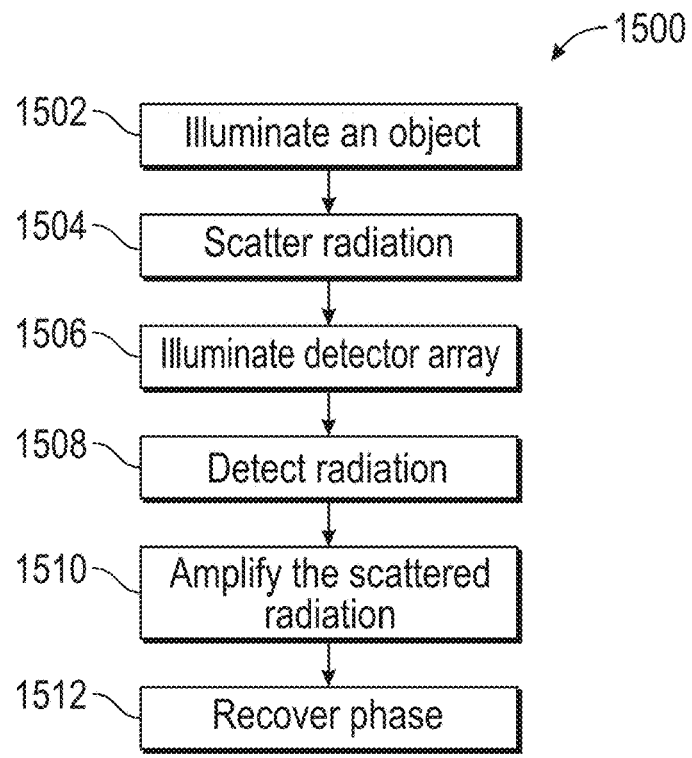
FIG. 15 illustrates a method of operating an imaging system, in accordance with an embodiment.

FIG. 15 illustrates a method 1500 of operating an imaging system, in accordance with an embodiment. The method 1500 includes step 1502 illuminating, with an illumination source, an object with radiation in terahertz frequencies. For example, illumination source 1410 illuminates an object 1440 with terahertz radiation.

The method 1500 includes step 1504, scattering, with the object, the radiation, wherein the scattered radiation has a phase. For example, scattered wave 1460 is created from the object 1440.

The method 1500 includes step 1506, illuminating, with a local oscillator source, a detector array. For example, local oscillator 1430 illuminates a detector array 1420.

The method 1500 includes step 1508, detecting, with the detector array, radiation comprising radiation scattered from the object and radiation from the local oscillator source. For example, the detector array 1420 detects the scattered wave 1460 and local oscillator radiation 1470.

The method 1500 includes step 1510, recovering the phase of the scattered radiation based on the detected radiation. For example, a phase is recovered from equation (8) based on the radiations detected at the detector array 1420.

In some embodiments, the method 1500 includes amplifying the scattered radiation by a gain to generate an intensity distribution associated with the radiation, wherein the gain is based on a power of a local oscillator illumination and an area of the detector array. For example, with reference to equation (8), the scattered waves power is amplified by a factor of $$\sqrt{\frac{P_{LO}}{A_{obs}}}.$$

In some embodiments, illuminating, with a local oscillator source, a detector array further comprises illuminating the detector array at an angle with respect to the scattered radiation, and an intensity distribution associated with the radiation includes a component comprising the phase and the angle. For example, the local oscillator radiation 1470 is illuminated at an angle θ with respect to the scattered radiation 1460, and equation (8) includes a term comprising the phase and the angle for phase recovery.

In some embodiments, recovering the phase of the scattered radiation based on the detected radiation further comprises recovering the phase from an intensity distribution associated with the detected radiation. For example, the scattered radiation phase tri can be recovered from equation (8).

In some embodiments, the method 1500 includes phase-locking the radiation illuminated from the illumination source and illumination from the local oscillator. For example, the illuminator radiation 1450 and local oscillator radiation 1470 are phase-locked.

Figure 16:
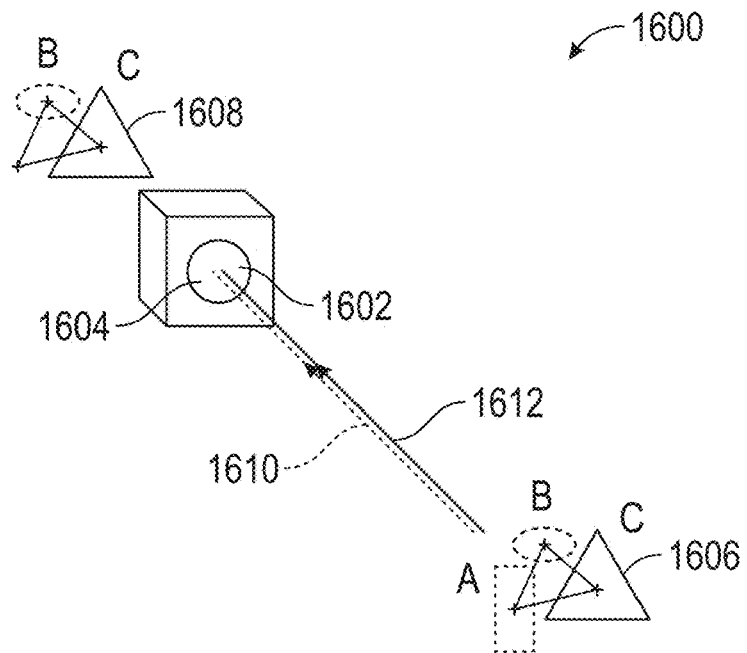
FIG. 16 illustrates a system, in accordance with an embodiment.

FIG. 16 illustrates a system 1600, in accordance with an embodiment. In some embodiments, the system is an exoscope that includes a plurality of imaging systems. In some embodiments, an exoscope includes a first imaging system that includes a first optical aperture and that captures first image data in a first spectral band; a second imaging system that includes a second optical aperture and that captures second image data in a second spectral band different from the first spectral band; and an image processor that receives the first image data, that receives the second image data, and that establishes common image features from the first image data and second image data. In some embodiments, the image processor computes correspondence geometry from the common image features.

In some embodiments, the first optical aperture 1602 is axially aligned with the second optical aperture 1604 (as used herein, axially alignment includes non-material deviations from perfect alignment). In some embodiments, the apertures 1602 and 1604 are configured to receive coaxially aligned radiation 1610 and 1612. In some examples, radiation 1610 and radiation 1612 include radiation in two different spectral bands. As an example, the system 1600 can capture an image of object 1606, which includes object elements A, B, and C, and generate an image 1608. Image elements B and C of image 1608 correspond to elements B and C of object 1606. In this example, element A of image 1608 may not associated with the frequency bands of radiation 1610 and 1612; therefore, only elements B and C of image 1608 appear in this example.

This may advantageously improve correspondence geometry (e.g., corresponding to image 1608). Also, this embodiment may be particularly advantageous where computer vision is unable to identify shared, distinctive features of an object 1606. In some embodiments, the first imaging system and the second imaging system share optics and portions of an optical path.

Figure 17A:
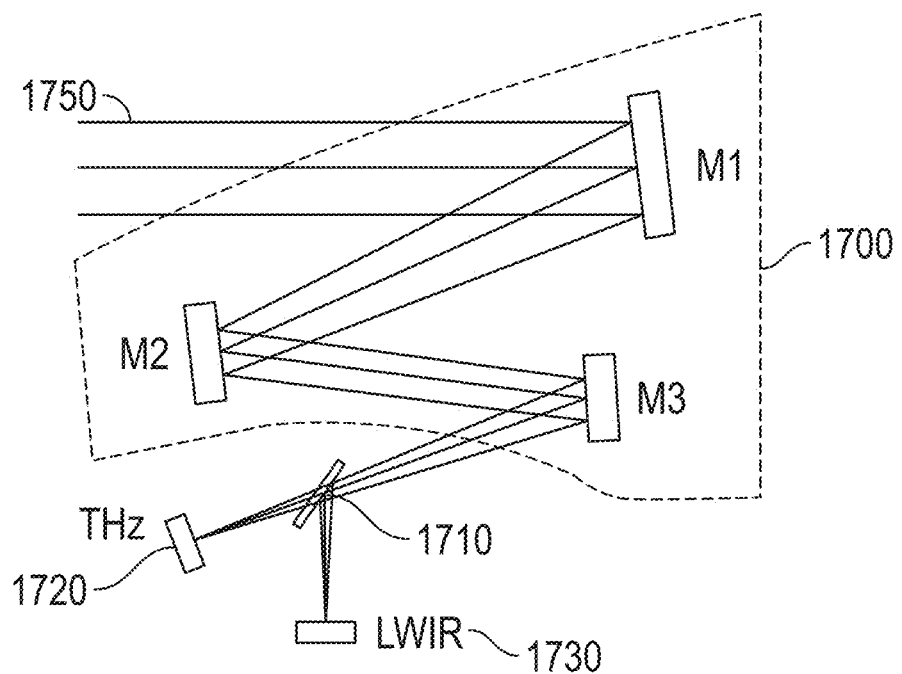
FIGS. 17A and 17B illustrate systems, in accordance with an embodiment.
Figure 17B:
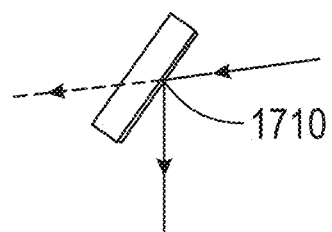

FIGS. 17A and 17B illustrate elements of imaging systems, in accordance with an embodiment. In some embodiments, system 1700 includes a reflective three-mirror anastigmat (TMA) 1700, including elements M1, M2, and M3, with a beam splitter 1710 that splits an incoming beam 1750 (e.g., radiation 1610 and radiation 1612) into the first spectral band (e.g., THz channel 1720) and the second spectral band (e.g., LWIR channel 1730).

Reflective optics, such as the TMA 1700, may be advantageous where refractive optics face challenges for common axis imaging. For example, the challenges may include large chromatic differences, including absorption, in the lens materials used between LWIR and THz waves. In such embodiments, a dichroic beamsplitter (e.g., beam splitter 1710, as illustrated in FIG. 17B) may separate the LWIR (e.g., LWIR channel 1730) and THz (e.g., THz channel 1720) channels. In some embodiments, the beam splitter 1710 includes a SiO2 substrate on a side where the combined radiation enters or exits and a transparent oxide conductor (e.g., ITO, IZO, ZnO) on a side where the individual radiation splits. In some examples, glass may be used to absorb LWIR and a transparent oxide may be used to reflect the LWIR radiation before it enters the glass.

In some embodiments, the first imaging system and the second imaging system share TMA optics configured to eliminate primary optical aberrations and incorporate a 50 cm working distance. For example, system 1600 includes a TMA and a beam splitter to separate an incoming radiation into two channels.

Figure 18A:
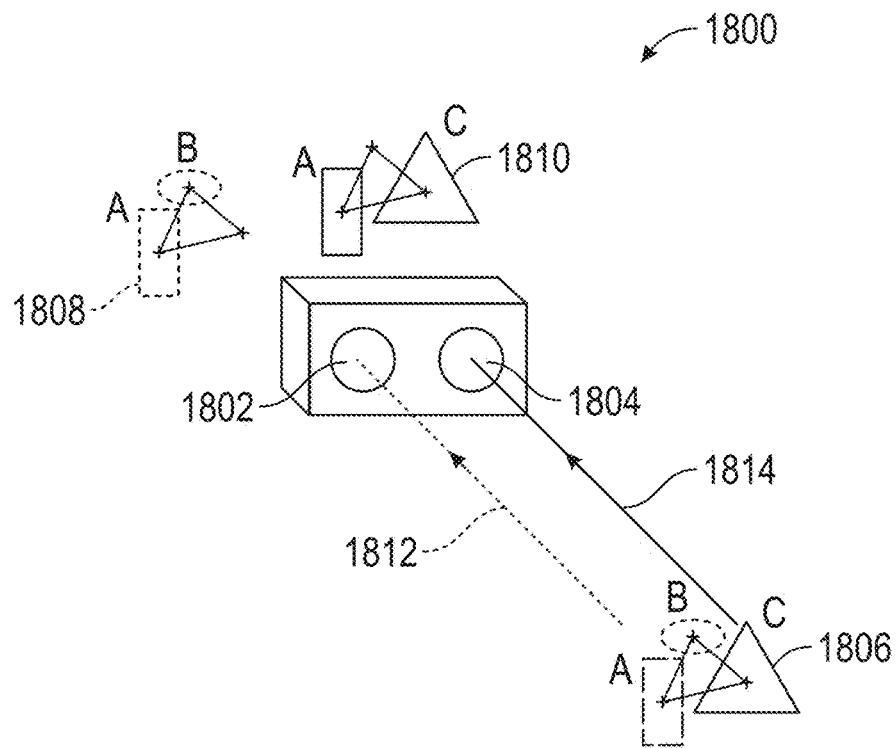
FIGS. 18A and 18B illustrate elements of the systems, in accordance with an embodiment.
Figure 18B:
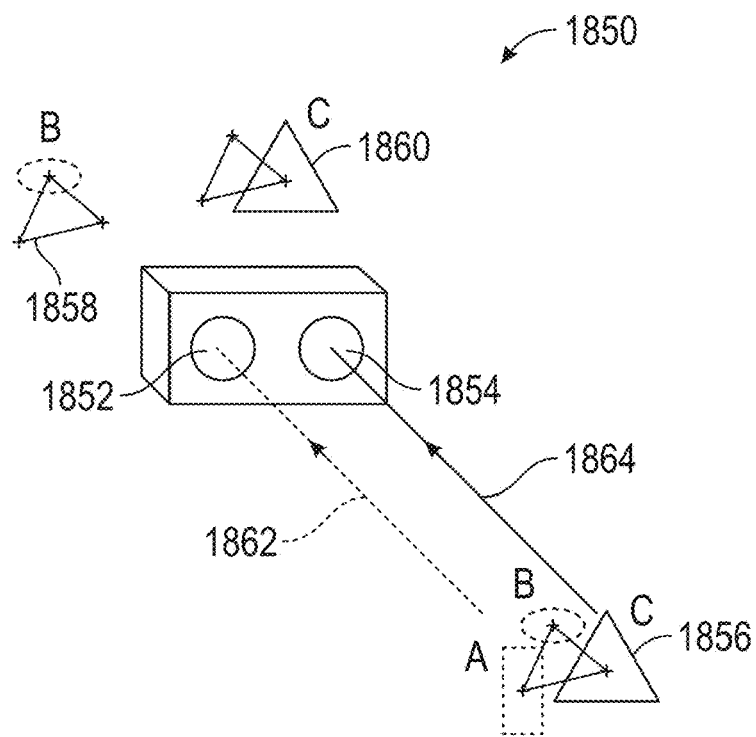

FIGS. 18A and 18B illustrate systems 1800 and 1850, in accordance with an embodiment. In some embodiments, the systems are exoscopes. In some embodiments, the first optical aperture (e.g., aperture 1802 and aperture 1852, respectively) is not axially aligned with the second optical aperture (e.g., aperture 1804 and aperture 1854, respectively). This may be advantageous where distinctive features (e.g., of object 1806 and of object 1856, respectively) are common to allow computer vision to align (translation, perspective correction) (e.g., of images 1808 and 1810 and of images 1858 and 1860, respectively).

In some embodiments, the first spectral band (e.g., band 1812 and band 1862, respectively) comprises long-wave infrared radiation and the second spectral band (e.g., band 1814 and band 1864, respectively) comprises terahertz radiation. The combination of LWIR and THz may be advantageous for exoscopes: LWIR camera sensors can provide images that correspond closely with visible imagery (so that correspondence can be easily established with visible camera sensors); THz imaging allows for biological tissue discrimination, especially as it pertains to water and/or lipid concentrations. Beneficial applications include medical applications, such as cancer/normal tissue discrimination for microscopy based microsurgery. In some embodiments, the exoscope includes a terahertz illuminator where the THz channel requires illumination (active imaging) In such embodiments, illumination and image capture may be synchronized (THz sensor needs global switch and pixel storage capacitors). In some embodiments, the LWIR camera sensors and THz camera sensors may be one or more of MEMS device 100, 200, 500, 904, and 1420.

In some examples, an image 1808 associated with band 1812 and aperture 1802 and an image 1810 associated with band 1814 and aperture 1804 can have spatial correspondence; element A is in both images 1808 and 1810. In some examples, an image 1858 associated with band 1862 and aperture 1852 and an image 1860 associated with band 1864 and aperture 1854 can have no spatial correspondence; no common element is in the images 1858 and 1860.

In some embodiments, the first spectral band comprises long-wave infrared radiation and the second spectral band comprises visible-wavelength radiation. It is understood that the systems 1600 and 1800 and element 1700 may operate in other combination of spectral bands.

Figure 19:
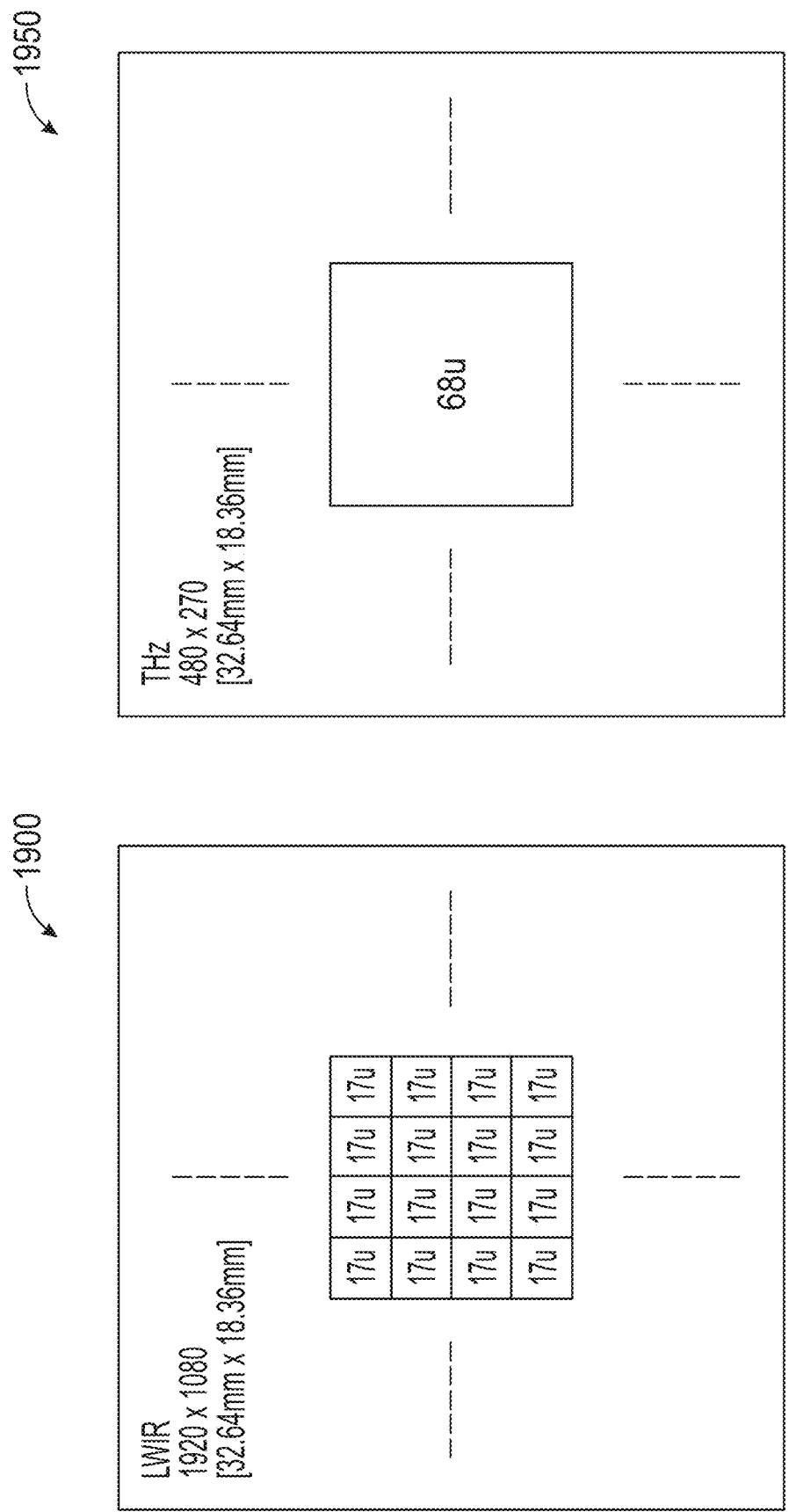
FIG. 19 illustrates elements of the systems, in accordance with an embodiment.

FIG. 19 illustrates elements of imaging systems, in accordance with an embodiment. FIG. 19 includes exemplary arrangements of LWIR detection pixel array 1900 and THz detection pixel array 1950 that can be used with an embodiment including long-wave infrared radiation and terahertz radiation. In some embodiments, the pixels of the arrays 1900 and 1950 correspond to the pixels 120, 600, and 700, as described with respect to FIGS. 1, 6, and 7. It is understood that the pixel array arrangements can be used with other combinations of radiation wavelengths. In the example, the long-wave infrared radiation wavelength can have a wavelength of 10 μm and the terahertz radiation have a wavelength of 0.15 mm (2 THz). In the example, the long-wave infrared and terahertz radiation may share the field of view.

In some embodiments, a method of operating a system including a first imaging system comprising a first optical aperture (e.g., aperture 1602, 1802, or 1852) and a second imaging system comprising a second optical aperture (e.g., aperture 1604, 1804, or 1854) includes capturing, with the first imaging system, first image data in a first spectral band, capturing, with the second imaging system, second image data in a second spectral band different from the first spectral band, receiving the captured first image data, receiving the captured second image data, and establishing common image features from the first image data and second image data. For example, the system 1600 captures images corresponding to two bands 1610 and 1612.

In some embodiments, the method includes computing correspondence geometry from the common image features. For example, elements A is a common image feature between images 1808 and 1810.

In some embodiments, the method includes axially aligning the first optical aperture with the second optical aperture. For example, the apertures 1602 and 1604 are coaxially aligned.

In some embodiments, the method includes sharing optics and portions of an optical path between the first imaging system and the second imaging system. For example, system 1600 includes shared optics and portions of an optical path.

In some embodiments, the method includes sharing a reflective TMA with a beam splitter between the first imaging system and the second imaging system; and splitting an incoming beam into the first spectral band and the second spectral band. For example, system 1600 includes a TMA 1700.

In some embodiments, the method includes sharing TMA optics between the first imaging system and the second imaging system; eliminating primary optical aberrations; and incorporating a 50 cm working distance. For example, TMA 1700 in system 1600 allows optics to be shared.

In some embodiments, the first optical aperture is not axially aligned with the second optical aperture. For example, in systems 1800 and 1850, the apertures are not axially aligned.

In some embodiments, the first spectral band comprises long-wave infrared radiation and the second spectral band comprises terahertz radiation. For example, systems 1600, 1800, and 1850 are configured to receive LWIR and terahertz radiation In some embodiments, the exoscope further comprises a terahertz illuminator. For example, systems 1600, 1800, and 1850 includes a terahertz illuminator, as disclosed herein.

Figure 20:
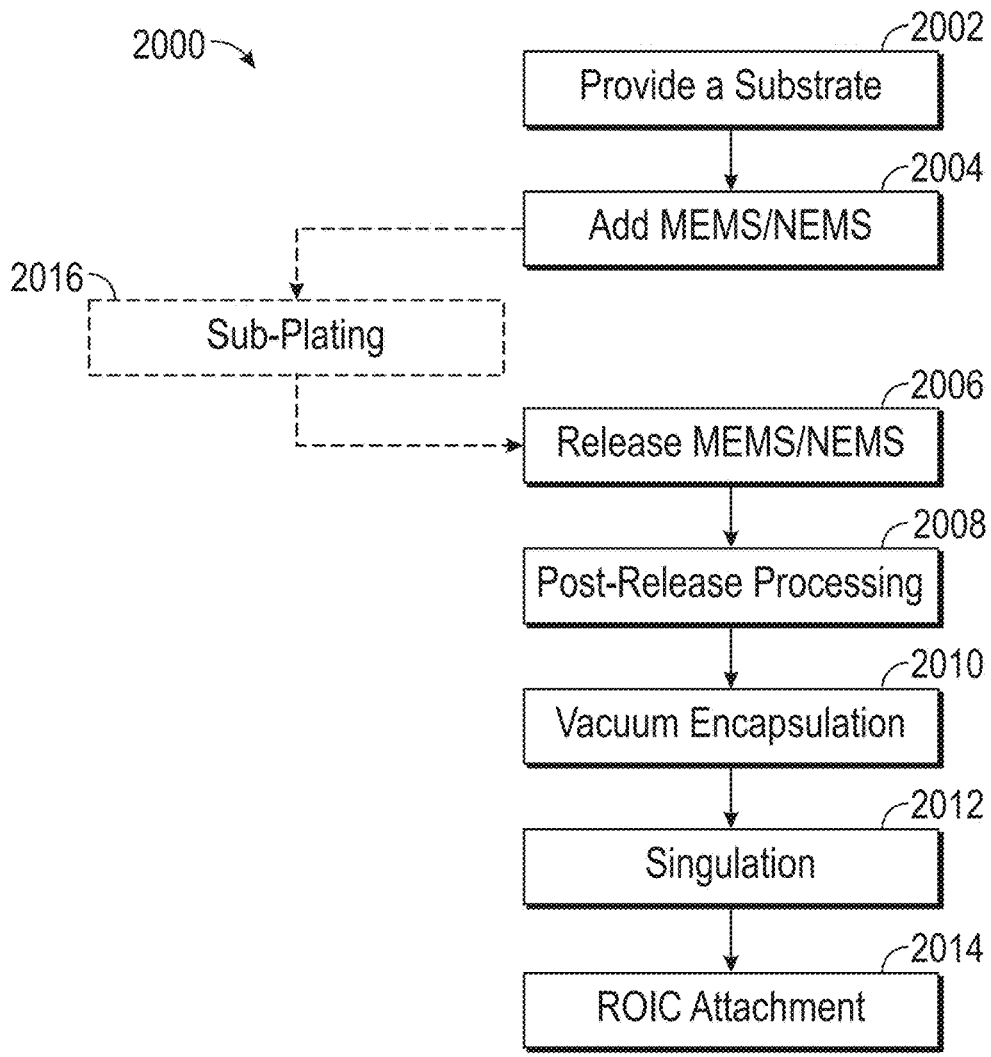
FIG. 20 illustrates a method of manufacturing a MEMS system, in accordance with an embodiment.

In some embodiments, the first spectral band comprises long-wave infrared radiation and the second spectral band comprises visible-wavelength radiation. For example, systems 1600, 1800, and 1850 are configured to receive LWIR and visible-wavelength radiation FIG. 20 illustrates a method 2000 of manufacturing an electromechanical system, in accordance with an embodiment. As non-limiting examples, the electrochemical system could be associated with MEMS devices 100, 200, 500, 902, 904, 1000, 1200, and 1420 (and related methods). To manufacture an electromechanical system, all or some of the process steps in method 2000 could be used and used in a different order. As a non-limiting example, Step 2014 could be performed before Step 2012.

Method 2000 includes Step 2002, providing a substrate. In some embodiments, the substrate is made of glass. In some embodiments, the substrate is low temperature polycrystalline silicon. In some embodiments, the substrate is a borosilicate that contains additional elements to fine tune properties. An example of a borosilicate is by Corning Eagle™, which produces an alkaline earth boro aluminosilicate (a silicate loaded with boron, aluminum, and various alkaline earth elements). Other variations are available from Asahi Glass™ or Schott™.

In some embodiments, a flat panel glass process is used to manufacture the electromechanical system. In some embodiments, a liquid crystal display (LCD) process is used to manufacture the electromechanical system. In some embodiments, an OLED display process or an x-ray panel process is used. Employing a flat panel glass process may allow for increased substrate sizes, thereby allowing for a higher number of electrochemical systems per substrate, which reduces processing costs. "Panel level" sizes can include 620 mm×750 mm, 680 mm×880 mm, 1100 mm×1300 mm, 1300 mm×1500 mm, 1500 mm×1850 mm, 1950 mm×2250 mm, and 2200 mm×2500 mm. Further, thin film transistors (TFTs) in panel level manufacturing can also reduce cost and so, for example, LCD-TFT processes can be beneficial.

Method 2000 includes Step 2004, adding MEMS to the substrate. Although MEMS is used to describe the addition of structures, it should be appreciated that other structures could be added without deviating from the scope of this disclosure. In some embodiments using panel level processing, the MEMS structures may be added using an LCD-TFT process.

Step 2004 may be followed by optional Step 2016, sub-plating. Step 2016 may be used when the substrate is larger than the processing equipment used in subsequent steps. For example, if using a panel level process (such as LCD), some embodiments will include (at Step 2004) cutting the panel into wafer sizes to perform further processing (using, for example, CMOS manufacturing equipment). In other embodiments, the same size substrate is used throughout method 2000 (i.e., Step 2016 is not used).

Method 2000 includes Step 2006, releasing the MEMS from the substrate.

Method 2000 includes Step 2008, post-release processing. Such post-release processing may prepare the MEMS structure for further process steps, such as planarization. In wafer-level processing, planarization can include chemical mechanical planarization. In some embodiments, the further process steps include etch back, where a photoresist is spun onto the topography to generate a more planar surface, which is then etched. Higher control of the etch time can yield a smoother surface profile. In some embodiments, the further process steps include "spin on glass," where glass-loaded organic binder is spun onto the topography and the result is baked to drive off organic solvents, leaving behind a surface that is smoother.

Method 2000 includes Step 2010, vacuum encapsulation of the MEMS structure, where necessary. Vacuum encapsulation may be beneficial to prolong device life.

Method 2000 includes Step 2012, singulation. Some embodiments may include calibration and chip programming, which may take into account the properties of the sensors. Methods described herein may be advantageous in glass substrate manufacturing processes because uniformity in glass lithography capabilities is limited. As a further advantage, glass has a lower thermal conductivity and so a glass substrate can be a better thermal insulator; by manufacturing thin structures separating a bolometer pixel from a glass substrate, embodiments herein may better serve to thermally isolate the glass bolometer pixel from the packaging environment.

Method 2000 includes Step 2014, attachment of a readout integrated circuit (ROIC) and flex/PCB attachment. As non-limiting examples, the readout circuits could be associated with MEMS device 100, 200, 500, 904, or 1420 (and related methods) or pixel elements 600 or 700. Processes and devices described herein may have the further advantage that the area required for signal processing can be much smaller than the sensing area which is dictated by the sensing physics. Typically, sensors are integrated on top of CMOS circuitry, and area driven costs lead to a technology node that is not optimal for the signal processing task. Processes described herein can use a more suitable CMOS and drive down the area required for signal processing, freeing the sensor from any area constraints by leveraging the low cost of FPD (flat panel display) manufacturing. In some embodiments, the ROIC is specifically designed for sensing a specific electromagnetic wavelength (such as X-Rays, THz, LWIR).

Figure 21:
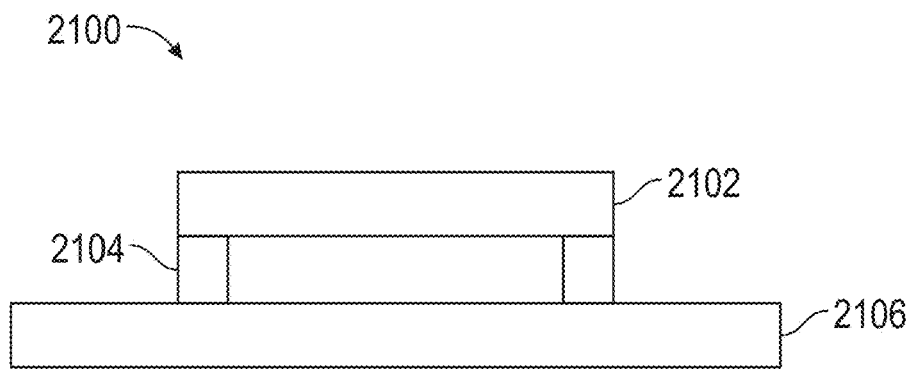
FIG. 21 illustrates an exemplary sensor.

FIG. 21 illustrates an exemplary sensor. In some embodiments, sensor 2100 is manufactured using method 2000. In some embodiments, pixel 120, 600, or 700 include sensor 2100. Sensor 2100 includes glass substrate 2106, structure 2104 less than 250 nm wide coupled to glass substrate 2106, and a sensor pixel 2102 coupled to the structure 2104. In some embodiments of sensor 2100, structure 2104 is a hinge that thermally separates the active area from the glass. In some embodiments, sensor 2100 receives an input current or charge and outputs an output current or charge based on the received radiation (e.g., the resistance between two terminals of the sensor changes in response to exposure to LWIR radiation).

In some embodiments, a sensor includes a glass substrate, a structure manufactured from any of the methods described herein and coupled to the glass substrate, and a sensor pixel coupled to the structure.

In some embodiments, a sensor includes a MEMS or NEMS device manufactured by a LCD-TFT manufacturing process and a structure manufactured by any of the methods described herein.

By way of examples, sensors can include resistive sensors and capacitive sensors. Bolometers can be used in a variety of applications. For example, long wave infra-red (LWIR, wavelength of approximately 8-14 µm) bolometers can be used in the automotive and commercial security industries. For example, LWIR bolometers with QVGA, VGA, and other resolution and terahertz (THz, wavelength of approximately 0.1-3 mm) bolometers can be used in security (e.g., airport passenger security screening) and medical (medical imaging) For example, THz bolometers with QVGA resolution and other resolutions. Some electrochemical systems can include X-Ray sensors or camera sensor systems. Similarly, LWIR and THz sensors are used in camera sensor systems. Some electromechanical systems are applied in medical imaging, such as endoscopes and exoscopes. X-ray sensors include direct and indirect sensing configurations.

Other electromechanical systems include scanners for light detection and ranging (LIDAR) systems. For example, optical scanners where spatial properties of a laser beam could be shaped (for, e.g., beam pointing). Electromechanical systems include inertial sensors (e.g., where the input stimulus is linear or angular motion). Some systems may be used in bio sensing and bio therapeutic platforms (e.g., where biochemical agents are detected).

Figure 22:
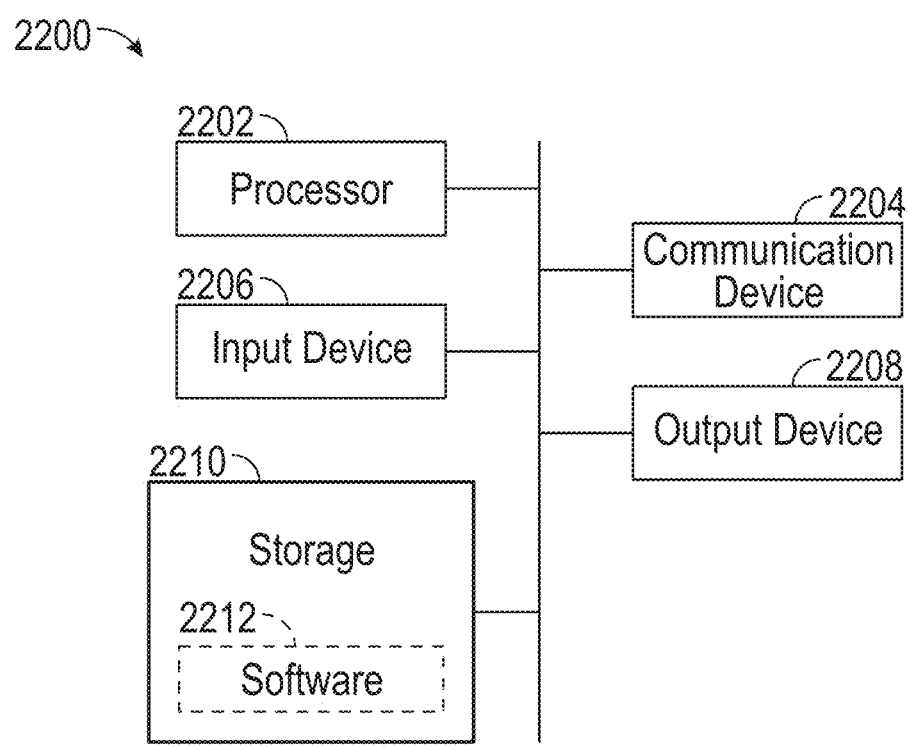
FIG. 22 illustrates an exemplary computing device, in accordance with an embodiment.

FIG. 22 illustrates an example of a computing device 2200, in accordance with an embodiment. In some embodiments, the device 2200 is configured to be coupled to the disclosed MEMS devices or systems and is configured to perform the operational methods associated with the MEMS devices or systems disclosed herein.

Device 2200 can be a host computer connected to a network. Device 2200 can be a client computer or a server. As shown in FIG. 22, device 2200 can be any suitable type of microprocessor-based device, such as a dedicated computing device, a personal computer, work station, server, or handheld computing device (portable electronic device) such as a phone or tablet. The device can include, for example, one or more of processors 2202, input device 2206, output device 2208, storage 2210, and communication device 2204. Input device 2206 and output device 2208 can generally correspond to those described above and can either be connectable or integrated with the computer.

Input device 2206 can be any suitable device that provides input, such as a camera sensor, touchscreen, keyboard or keypad, mouse, or voice-recognition device. Output device 2208 can be any suitable device that provides output, such as an illuminator, a touchscreen, haptics device, or speaker.

Storage 2210 can be any suitable device that provides storage, such as an electrical, magnetic, or optical memory including a RAM, cache, hard drive, or removable storage disk. Communication device 2204 can include any suitable device capable of transmitting and receiving signals over a network, such as a network interface chip or device. The components of the computer can be connected in any suitable manner, such as via a physical bus, or wirelessly.

Software 2212, which can be stored in storage 2210 and executed by processor 2202, can include, for example, the programming that embodies the functionality of the present disclosure (e.g., as embodied in the devices described above).

Software 2212 can also be stored and/or transported within any non-transitory, computer-readable storage medium for use by or in connection with an instruction execution system, apparatus, or device, such as those described above, that can fetch instructions associated with the software from the instruction execution system, apparatus, or device and execute the instructions. In the context of this disclosure, a computer-readable storage medium can be any medium, such as storage 2210, that can contain or store programming for use by or in connection with an instruction-execution system, apparatus, or device.

Software 2212 can also be propagated within any transport medium for use by or in connection with an instruction-execution system, apparatus, or device, such as those described above, that can fetch instructions associated with the software from the instruction-execution system, apparatus, or device and execute the instructions. In the context of this disclosure, a transport medium can be any medium that can communicate, propagate, or transport programming for use by or in connection with an instruction-execution system, apparatus, or device. The transport readable medium can include, but is not limited to, an electronic, magnetic, optical, electromagnetic, or infrared wired or wireless propagation medium.

Device 2200 may be connected to a network, which can be any suitable type of interconnected communication system. The network can implement any suitable communications protocol and can be secured by any suitable security protocol. The network can comprise network links of any suitable arrangement that can implement the transmission and reception of network signals, such as wireless network connections, T1 or T3 lines, cable networks, DSL, or telephone lines.

Device 2200 can implement any operating system suitable for operating on the network. Software 2212 can be written in any suitable programming language, such as C, C++, Java, or Python. In various embodiments, application software embodying the functionality of the present disclosure can be deployed in different configurations, such as in a client/server arrangement or through a Web browser as a Web-based application or Web service, for example.

In one aspect, a microelectromechanical system comprises a glass substrate configured to pass radiation from a first surface of the glass substrate through a second surface of the glass substrate, the glass substrate comprising TFT circuitry; a lid comprising a surface; spacers separating the lid and glass substrate; a cavity defined by the spacers, surface of the lid, and second surface of the glass substrate; a pixel in the cavity, positioned on the second surface of the glass substrate, electrically coupled to the TFT circuitry, and comprising an absorber to detect the radiation; and a reflector to direct the radiation to the absorber and positioned on the lid.

In some aspects of the above system, the spacers include material from a sacrificial layer.

In some aspects of the above systems, the reflector and absorber are separated by one quarter of the wavelength of the radiation.

In some aspects of the above systems, the reflector comprises a plurality of reflectors, each corresponding to a respective pixel.

In some aspects of the above systems, the substrate includes one or more of fused silica and quartz and has a thickness in the range 50 to 200 μm.

In some aspects of the above systems, the microelectromechanical system further comprises a plurality of pixels in the cavity.

In some aspects of the above systems, the reflector is positioned on a surface of the lid.

In some aspects of the above systems, the reflector is the lid.

In some aspects of the above systems, the reflector is inside the lid.

In one aspect, a method of manufacturing a microelectromechanical system comprises: providing a glass substrate comprising TFT circuitry and configured to pass radiation from a first surface of the glass substrate through a second surface of the glass substrate; disposing a pixel comprising an absorber to detect the radiation on the second surface of the glass substrate; attaching spacers to the second surface of the glass substrate; positioning a reflector on a lid, the reflector configured to direct the radiation to the absorber; and attaching the lid to the spacers.

In some aspects of the above method, the method further comprises forming a cavity defined by the spacers, the lid, and the second surface of the glass substrate.

In some aspects of the above methods, the method further comprises forming the spacers using material from a sacrificial layer.

In some aspects of the above methods, the method further comprises separating the reflector and absorber by one quarter of the wavelength of the radiation.

In some aspects of the above methods, positioning the reflector comprises positioning a plurality of reflectors, each corresponding to a respective pixel.

In some aspects of the above methods, the substrate includes one or more of fused silica and quartz and has a thickness in the range 50 to 200 μm.

In some aspects of the above methods, the method further comprises disposing a plurality of pixels on the second surface of the glass substrate.

In some aspects of the above methods, the method further comprises positioning the reflector on the lid.

In some aspects of the above methods, the reflector is the lid.

In some aspects of the above methods, the method further comprises positioning the reflector in the lid.

In one aspect, a microelectromechanical system comprises: a plurality of pixels; a plurality of local capacitors; and a plurality of global sampling switches, each electrically coupled to a respective pixel, a respective local capacitor, and a globally addressed sampling signal, wherein the globally addressed sampling signal is configured to electrically couple each pixel to the respective local capacitor by switching the plurality of global sampling switches to a conducting state, and the plurality of pixels are configured to sense radiation in terahertz frequencies.

In some aspects of the above system, the microelectromechanical system further comprises a plurality of readout switches, wherein the plurality of readout switches and the plurality of local capacitors are arranged in rows, each row associated with a row address, each readout switch is electrically coupled to a respective local capacitor, a column associated with a column address and electrically coupled to readout circuitry, and a respective row addressing signal configured to electrically couple the respective local capacitor to the column and the readout circuitry by switching the readout switch to a conducting state, and each pixel includes a unique address comprising a unique combination of the row address and the column address.

In some aspects of the above systems, each pixel comprises sub-pixels, and each local capacitor is configured to sample a total pixel charge corresponding to the sub-pixels of the corresponding pixel.

In one aspect, a method of operating a microelectromechanical system comprising a plurality of pixels, a plurality of local capacitors, and a plurality of global sampling switches each electrically coupled to a respective pixel, a respective local capacitor, and a globally addressed sampling signal, the method comprises: switching, with the globally addressed sampling signal, the plurality of global sampling switches to a conducting state; electrically coupling each pixel to the respective local capacitor; sensing, with the plurality of pixels, a radiation in terahertz frequencies; generating a current at each pixel based on the sensed radiation and a bias voltage; and charging the respective local capacitor with the current.

In some aspects of the above method, the microelectromechanical system further comprises a plurality of readout switches, the plurality of readout switches and the plurality of local capacitors are arranged in rows, each row associated with a row address, each readout switch is electrically coupled to a respective local capacitor, a column associated with a column address and electrically coupled to readout circuitry, and a respective row addressing signal, and each pixel includes a unique address comprising a unique combination of the row address and the column address, the method further comprises: switching, with the respective row addressing signal, a readout switch to a conducting state; electrically coupling the respective local capacitor to a respective column; and discharging the respective local capacitor to the respective column and the readout circuitry.

In some aspects of the above methods, each pixel comprises sub-pixels, the method further comprises: sampling, with each local capacitor, a total pixel charge corresponding to the sub-pixels of the corresponding pixel.

In one aspect, an illumination source comprises: a voltage source; a wire grid electrically coupled to the voltage source, configured to transmit radiation at a wavelength, and having a pitch at a first fraction of the wavelength; a reflective surface separated from the wire grid by a second fraction of the wavelength; and spacers separating the wire grid and the reflective surface.

In some aspects of the above illumination source, the wavelength is in a range of 0.1 millimeter to 3 millimeters.

In some aspects of the above illumination sources, the first fraction is up to four-fifths and the second fraction is one quarter.

In some aspects of the above illumination sources, the reflective surface comprises an electrically conductive material.

In some aspects of the above illumination sources, a surface impedance of the wire grid matches an impedance of a medium in which the radiation is transmitted, and the surface impedance is based on a thickness of the wire grid.

In some aspects of the above illumination sources, the wire grid comprises one or more selected from a conductive oxide, conductive nitride, and silicide.

In some aspects of the above illumination sources, the wire grid is annealed.

In some aspects of the above illumination sources, the illuminator source further comprises a wire grid support comprising a thermally insulating material.

In some aspects of the above illumination sources, the illuminator source further comprises a second reflective surface separated from the wire grid by a third fraction of a second wavelength, wherein the wire grid is further configured to transmit radiation at the second wavelength.

In some aspects of the above illumination sources, the wire grid comprises a diamond pattern.

In some aspects of the above illumination sources, the wire grid comprises a periodic pattern.

In one aspect, a method of manufacturing an illumination source, comprises: providing a wire grid configured to transmit radiation at a wavelength, and having a pitch at a first fraction of the wavelength; providing a reflective surface; separating the wire grid and the reflective surface with spacers, the reflective surface separated from the wire grid by a second fraction of the wavelength; and electrically coupling a voltage source to the wire grid.

In some aspects of the above method, the wavelength is in a range of 0.1 millimeter to 3 millimeters.

In some aspects of the above methods, the first fraction is up to four-fifths and the second fraction is one quarter.

In some aspects of the above methods, the reflective surface comprises an electrically conductive material.

In some aspects of the above methods, a surface impedance of the wire grid matches a medium in which the radiation is transmitted, and the surface impedance is based on a thickness of the wire grid.

In some aspects of the above methods, the wire grid comprises one or more selected from a conductive oxide, conductive nitride, and silicide.

In some aspects of the above methods, the method further comprises annealing the wire grid.

In some aspects of the above methods, the method further comprises providing a wire grid support comprising a thermally insulating material.

In some aspects of the above methods, the method comprises providing a second reflective surface separated from the wire grid by a third fraction of a second wavelength, wherein the wire grid is further configured to transmit radiation at the second wavelength.

In some aspects of the above methods, the method further comprises forming the wire grid in a diamond pattern.

In some aspects of the above methods, the method further comprises forming the wire grid in a periodic pattern.

In one aspect, an imaging system comprises: an illumination source configured to illuminate an object with radiation in terahertz frequencies, the object scattering the radiation, the scattered radiation having a phase; a detector array; and a local oscillator source configured to illuminate the detector array, wherein the detector array is configured to detect radiation comprising radiation scattered from the object and radiation from the local oscillator source, a power of the detected radiation is greater than a power of the scattered radiation, and an intensity distribution associated with the detected radiation includes information associated with the phase.

In some aspects of the above imaging system, an intensity distribution associated with the radiation includes the scattered radiation amplified by a gain, the gain is based on a power of a local oscillator illumination and an area of the detector array.

In some aspects of the above imaging systems, the local oscillator source is further configured to illuminate the detector array at an angle with respect to the scattered radiation, and an intensity distribution associated with the radiation includes a component comprising the phase and the angle.

In some aspects of the above imaging systems, the imaging system further comprises: a processor; memory; and a program stored in the memory and configured to be executed by the processor, the program including instructions for performing a method comprising recovering the phase from an intensity distribution associated with the detected radiation.

In some aspects of the above imaging systems, the radiation from the illumination source and illumination from the local oscillator are phase-locked.

In one aspect, a method of operating an imaging system comprises: illuminating, with an illumination source, an object with radiation in terahertz frequencies; scattering, with the object, the radiation, wherein the scattered radiation has a phase; illuminating, with a local oscillator source, a detector array; detecting, with the detector array, radiation comprising radiation scattered from the object and radiation from the local oscillator source; and recovering the phase of the scattered radiation based on the detected radiation.

In some aspects of the above method, the method further comprises amplifying the scattered radiation by a gain to generate an intensity distribution associated with the radiation, wherein the gain is based on a power of a local oscillator illumination and an area of the detector array.

In some aspects of the above methods, illuminating, with a local oscillator source, a detector array further comprises illuminating the detector array at an angle with respect to the scattered radiation, and an intensity distribution associated with the radiation includes a component comprising the phase and the angle.

In some aspects of the above methods, recovering the phase of the scattered radiation based on the detected radiation further comprises recovering the phase from an intensity distribution associated with the detected radiation.

In some aspects of the above methods, the method further comprises phase-locking the radiation illuminated from the illumination source and illumination from the local oscillator.

In one aspect, a microelectromechanical system comprises: a pixel comprising an absorber to detect radiation having a wavelength; and a reflector to direct radiation transmitted through the absorber, wherein the directed radiation and the radiation transmitted through the absorber have a phase difference, the reflector and the absorber are separated by a distance associated with a second phase, and twice the second phase added to the phase difference equals zero or 360 degrees.

In some aspects of the above system, the reflector comprises a metasurface including electromagnetic structures, the electromagnetic structures are smaller than the wavelength and configured for electromagnetic polarization, and the metasurface is configured to direct the radiation transmitted through the absorber.

In some aspects of the above systems, the reflector comprises a high impedance conductor.

In some aspects of the above systems, the microelectromechanical system further comprises a plurality of pixels, each pixel comprising an absorber to detect the radiation.

In one aspect, a method of manufacturing a microelectromechanical system comprises: providing a pixel comprising an absorber to detect radiation having a wavelength; providing a reflector to direct radiation transmitted through the absorber; and separating the reflector and the absorber by a distance associated with a second phase, wherein the directed radiation and the radiation transmitted through the absorber have a phase difference, and twice the second phase added to the phase difference equals zero or 360 degrees.

In some aspects of the above method, providing the reflector further comprises providing a metasurface including electromagnetic structures, the electromagnetic structures are smaller than the wavelength and configured for electromagnetic polarization, and the metasurface is configured to direct the radiation transmitted through the absorber.

In some aspects of the above methods, providing the reflector further comprises providing a high impedance conductor.

In some aspects of the above methods, the method further comprises providing a plurality of pixels, each pixel comprising an absorber to detect the radiation.

In one aspect, a system comprises: a first imaging system comprising a first optical aperture and configured to capture first image data in a first spectral band; a second imaging system comprising a second optical aperture and configured to capture second image data in a second spectral band different from the first spectral band; and an image processor configured to: receive the first image data, receive the second image data, and establish common image features from the first image data and second image data.

In some aspects of the above system, the image processor is further configured to compute correspondence geometry from the common image features.

In some aspects of the above systems, the first optical aperture is axially aligned with the second optical aperture.

In some aspects of the above systems, the first imaging system and the second imaging system share optics and portions of an optical path.

In some aspects of the above systems, the first imaging system and the second imaging system share a reflective three-mirror anastigmat (TMA) with a beam splitter that splits an incoming beam into the first spectral band and the second spectral band.

In some aspects of the above systems, the first imaging system and the second imaging system share TMA optics configured to eliminate primary optical aberrations and incorporate a 50 cm working distance.

In some aspects of the above systems, the first optical aperture is not axially aligned with the second optical aperture.

In some aspects of the above systems, the first spectral band comprises long-wave infrared radiation and the second spectral band comprises terahertz radiation.

In some aspects of the above systems, the system further comprises a terahertz illuminator.

In some aspects of the above systems, the first spectral band comprises long-wave infrared radiation and the second spectral band comprises visible-wavelength radiation.

In one aspect, a method of operating a system comprising a first imaging system comprising a first optical aperture and a second imaging system comprising a second optical aperture, the method comprises: capturing, with the first imaging system, first image data in a first spectral band; capturing, with the second imaging system, second image data in a second spectral band different from the first spectral band; receiving the captured first image data; receiving the captured second image data; and establishing common image features from the first image data and second image data.

In some aspects of the above method, the method further comprises computing correspondence geometry from the common image features.

In some aspects of the above methods, the method further comprises axially aligning the first optical aperture with the second optical aperture.

In some aspects of the above methods, the method further comprises sharing optics and portions of an optical path between the first imaging system and the second imaging system.

In some aspects of the above methods, the method further comprises: sharing a reflective TMA with a beam splitter between the first imaging system and the second imaging system; and splitting an incoming beam into the first spectral band and the second spectral band.

In some aspects of the above methods, the method further comprises: sharing TMA optics between the first imaging system and the second imaging system; eliminating primary optical aberrations; and incorporating a 50 cm working distance.

In some aspects of the above methods, the method further comprises the first optical aperture is not axially aligned with the second optical aperture.

In some aspects of the above methods, the first spectral band comprises long-wave infrared radiation and the second spectral band comprises terahertz radiation.

In some aspects of the above methods, the exoscope further comprises a terahertz illuminator.

In some aspects of the above methods, the first spectral band comprises long-wave infrared radiation and the second spectral band comprises visible-wavelength radiation.

Although "electrically coupled" and "coupled" are used to describe the electrical connections between two elements of the readout circuit in this disclosure, it is understood that the electrical connections do not necessarily need direct connection between the terminals of the components being coupled together. Different combinations and connections of the recited components can achieve a constant current and adjustable bias voltage readout circuit without departing from the scope of this disclosure. For example, electrical routing connects between the terminals of the components being electrically coupled together. In another example, a closed (conducting) switch is connected between the terminals of the components being coupled together. In yet another example, additional elements connect between the terminals of the components being coupled together without affecting the constant current characteristics of the circuit. For example, buffers, amplifiers, and passive circuit elements can be added without affecting the characteristics of the readout circuit and departing from the scope of this disclosure.

In some embodiments, two electrically coupled components may be topologically coupled. As used herein, two components are "topologically coupled" if they provide an electrical influence on one another within a topology or a same part of a topology. For example, the reference sensor and the first current source of the disclosed readout circuits are electrically coupled on a same reference branch of the readout circuit.

Similarly, although "electrically uncoupled" is used to describe electrical disconnects between two elements of the readout circuit in this disclosure, it is understood that electrical disconnects do not necessarily need to be physically open between the terminals of the components being switched. It is also understood that "uncoupled" is not limited to mean prevention of electrical energy transfer between two elements. For example, high-impedance elements are connected between the terminals of the components being uncoupled. In another example, an opened (non-conducting) switch is connected between the terminals of the components being uncoupled, effectively uncoupling the components.

Generally, as used herein, the term "substantially" is used to describe element(s) or quantit(ies) ideally having an exact quality (e.g., fixed, the same, uniformed, equal, similar, proportional), but practically having qualities functionally equivalent to the exact quality. For example, an element or quantity described as being substantially fixed or uniformed can deviate from the fixed or uniformed value, as long as the deviation is within a tolerance of the system (e.g., accuracy requirements, etc.). As another example, two elements or quantities described as being substantially equal can be approximately equal, as long as the difference is within a tolerance that does not functionally affect a system's operation.

Likewise, although some elements or quantities are described in an absolute sense without the term "substantially", it is understood that these elements and quantities can have qualities that are functionally equivalent to the absolute descriptions. For example, in some embodiments, a ratio is described as being one. However, it is understood that the ratio can be greater or less than one, as long as the ratio is within a tolerance of the system (e.g., accuracy requirements, etc.).

As used herein, "substantially the same" sensors produce a similar response to a given stimulus. For example, "substantially the same" bolometers produce a similar resistance change for a given temperature change.

Although the disclosed embodiments have been fully described with reference to the accompanying drawings, it is to be noted that various changes and modifications will become apparent to those skilled in the art. Such changes and modifications are to be understood as being included within the scope of the disclosed embodiments as defined by the appended claims.

The terminology used in the description of the various described embodiments herein is for the purpose of describing particular embodiments only and is not intended to be limiting. As used in the description of the various described embodiments and the appended claims, the singular forms "a", "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

We claim:

1. A microelectromechanical system, comprising:
   a substrate comprising a surface;
   a lid comprising a surface;
   spacers separating the lid and the substrate, wherein each of the spacers is coupled to the surface of the substrate and the surface of the lid;
   a cavity defined by the spacers, the surface of the lid, and the surface of the substrate;
   a pixel in the cavity to detect radiation, the pixel positioned on the surface of the substrate; and
   a reflector comprising an antenna structure and a transmission line to:
      direct the radiation to the pixel; and
      shift a phase of the radiation.

2. The microelectromechanical system of claim 1, wherein the reflector further comprises a second antenna structure and a second transmission line to direct the radiation to the pixel and shift the phase of the radiation.

3. The microelectromechanical system of claim 2, wherein the first antenna structure is associated with a first polarization and the second antenna structure is associated with a second polarization different from the first polarization.

4. The microelectromechanical system of claim 1, wherein a size of the antenna structure and a size of the transmission line are associated with the phase.

5. The microelectromechanical system of claim 4, wherein the size of the antenna structure is smaller than a wavelength of the radiation.

6. The microelectromechanical system of claim 1, wherein the phase shift plus a distance between the pixel and the reflector equal a fraction of a wavelength of the radiation.

7. The microelectromechanical system of claim 1, wherein a wavelength of the radiation is 0.1-3 mm.

8. The microelectromechanical system of claim 1, wherein the pixel comprises a bolometer pixel.

9. The microelectromechanical system of claim 1, wherein the radiation comprises radiation scattered from an object and radiation from a first illumination source.

10. The microelectromechanical system of claim 9, wherein:
the radiation scattered from the object comprises radiation from a second illumination source scattered by the object, and
the first illumination source and the second illumination source are phase-locked.

11. The microelectromechanical system of claim 9, wherein the pixel is configured to output a signal for determining a phase of the radiation scattered from the object.

12. The microelectromechanical system of claim 11, wherein the signal is further for determining an amplitude of the radiation scattered from the object.

13. The microelectromechanical system of claim 1, further comprising an absorber to absorb a portion of the radiation, the absorber coupled to the pixel and positioned on the surface of the substrate.

14. A method of manufacturing a microelectromechanical system, comprising:
providing a substrate comprising a surface;
providing a lid comprising a surface;
providing spacers to separate the lid and the substrate;
coupling each of the spacers to the surface of the substrate and the surface of the lid, wherein the spacers, the surface of the lid, and the surface of the substrate define a cavity;
providing a pixel in the cavity to detect radiation;
positioning the pixel on the surface of the substrate; and
providing a reflector comprising an antenna structure and a transmission line to:
direct the radiation to the pixel; and
shift a phase of the radiation.

15. The method of claim 14, further comprising positioning the reflector on the surface of the lid.

16. The method of claim 14, wherein the reflector further comprises a second antenna structure and a second transmission line to direct the radiation to the pixel and shift the phase of the radiation.

17. The method of claim 14, wherein the pixel comprises a bolometer pixel.

18. The method of claim 14, further comprising:
providing an absorber;
coupling the absorber to the pixel; and
positioning the absorber on the surface of the substrate.

19. A method for operating a microelectromechanical system (MEMS), wherein the MEMS comprises:
a substrate comprising a surface;
a lid comprising a surface;
spacers separating the lid and the substrate, wherein each of the spacers is coupled to the surface of the substrate and the surface of the lid;
a cavity defined by the spacers, the surface of the lid, and the surface of the substrate;
a pixel in the cavity, the pixel positioned on the surface of the substrate; and
a reflector comprising an antenna structure and a transmission line, wherein the method comprises:
receiving radiation;
directing, via the antenna structure and the transmission line, the radiation to the pixel;
shifting, via the antenna structure and the transmission line, a phase of the radiation; and
detecting, via the pixel, the radiation.

20. The method of claim 19, wherein the radiation comprises radiation scattered from an object and radiation from an illumination source.

* * * * *